US012740453B2

(12) United States Patent
Morinaga et al.

(10) Patent No.: US 12,740,453 B2
(45) Date of Patent: Sep. 15, 2026

(54) SEMICONDUCTOR MODULE

(71) Applicant: SHINDENGEN ELECTRIC MANUFACTURING CO., LTD., Tokyo (JP)

(72) Inventors: Yuji Morinaga, Saitama (JP); Junya Yuguchi, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 339 days.

(21) Appl. No.: 18/637,365

(22) Filed: Apr. 16, 2024

(65) Prior Publication Data

US 2024/0379572 A1 Nov. 14, 2024

(30) Foreign Application Priority Data

May 12, 2023 (JP) ................................ 2023-079107

(51) Int. Cl.

| | |
|---|---|
| ***H10W 70/65*** | (2026.01) |
| ***H10W 20/40*** | (2026.01) |
| ***H10W 40/25*** | (2026.01) |
| ***H10W 70/60*** | (2026.01) |
| ***H10W 72/50*** | (2026.01) |
| ***H10W 74/10*** | (2026.01) |
| ***H10W 90/00*** | (2026.01) |

(52) U.S. Cl.

CPC ......... *H10W 70/65* (2026.01); *H10W 20/496* (2026.01); *H10W 70/611* (2026.01); *H10W 90/00* (2026.01); *H10W 40/255* (2026.01); *H10W 72/5522* (2026.01); *H10W 72/5524* (2026.01); *H10W 72/5525* (2026.01); *H10W 74/10* (2026.01); *H10W 90/754* (2026.01)

(58) Field of Classification Search

None

See application file for complete search history.

(56) References Cited

U.S. PATENT DOCUMENTS

2018/0108598 A1* 4/2018 Niu ..................... H10W 70/411
2018/0366567 A1* 12/2018 Morinaga .............. H10D 30/47
2018/0367054 A1* 12/2018 Morinaga ............. H02M 7/003

(Continued)

FOREIGN PATENT DOCUMENTS

WO 2020241239 A1 12/2020

*Primary Examiner* — Alexander G Ghyka

(74) *Attorney, Agent, or Firm* — HAUPTMAN HAM, LLP

(57) ABSTRACT

In a semiconductor module, first and third chips are disposed symmetrically with respect to a center line. Second and fourth chips are disposed symmetrically with respect to the center line. First and third wiring patterns are disposed symmetrically with respect to the center line. Second and fourth wiring patterns are disposed symmetrically with respect to the center line. Two intermediate points are disposed symmetrically with respect to the center line. Two second power terminals are disposed symmetrically with respect to the center line. A fifth wiring pattern and a first power terminal are disposed symmetrically with respect to the center line. The intermediate points are adjacent to each other on one side of the module. All power terminals are on the other side of the module. The first power terminal is above the fifth wiring pattern in a non-contact state and connects the first and third wiring patterns.

7 Claims, 14 Drawing Sheets

(56) References Cited

U.S. PATENT DOCUMENTS

| | | | | |
|---|---|---|---|---|
| 2022/0139797 | A1* | 5/2022 | Takahashi ............ | H10W 40/10<br>257/712 |
| 2024/0312922 | A1* | 9/2024 | Morinaga ............ | H10W 70/65 |
| 2024/0347466 | A1* | 10/2024 | Morinaga ............ | H10W 70/65 |
| 2024/0355717 | A1* | 10/2024 | Hesener .............. | H10W 90/811 |
| 2024/0395676 | A1* | 11/2024 | Böhm ................. | H10W 70/481 |

* cited by examiner

51

SEMICONDUCTOR MODULE

TECHNICAL FIELD

The present invention relates to a semiconductor module.

BACKGROUND ART

Conventionally, there has been popularly adopted a configuration where a bridge circuit is formed of a plurality of semiconductor chips. In the bridge circuit, there is a case where an electric power loss or ringing occurs attributed to a parasitic inductance in a circuit. Particularly, in a case where a wide band gap semiconductor is used as a semiconductor chip, such a semiconductor exhibits a high through rate and a high operation frequency and hence, an electric power loss or ringing is likely to be generated due to a parasitic inductance in a circuit. The magnitude of the parasitic inductance largely depends on a wiring path length (also referred to as a current path length) and hence, the modularization of a circuit is also considered for reducing the parasitic inductance (see patent literature 1, for example).

FIG. 14 is a plan view illustrating the internal configuration of a semiconductor device 900 described in patent literature 1. In the semiconductor device 900 described in patent literature 1, a current path when both a first semiconductor chip Q1 and a fourth semiconductor chip Q4 are in an ON state, as indicated by a solid line A in FIG. 14, is a path where a current flows from a first power source terminal 911, flows through the first semiconductor chip Q1 and reaches a first intermediate point terminal 921, and flows through a load not illustrated in the drawing from the first intermediate point terminal 921 and, thereafter, flows from a second intermediate point terminal 922, flows through the fourth semiconductor chip Q4, and reaches a second power source terminal 912.

On the other hand, a current path when both a third semiconductor chip Q3 and a second semiconductor chip Q2 are in an ON state is, as illustrated by a broken line B in FIG. 14, a path where a current flows from the first power source terminal 911 and flows through the third semiconductor chip Q3 and reaches the second intermediate terminal 922, flows from the second intermediate point terminal 922 and flows through a load not illustrated in the drawing and, thereafter, flows from the first intermediate point terminal 921, flows through the second semiconductor chip Q2, and reaches the second power source terminal 912.

In a state where both the first semiconductor chip Q1 and the fourth semiconductor chip Q4 are in an ON state, both the third semiconductor chip Q3 and the second semiconductor chip Q2 are in an OFF state. On the other hand, in a state where both the third semiconductor chip Q3 and the second semiconductor chip Q2 are in an ON state, both the first semiconductor chip Q1 and the fourth semiconductor chip Q4 are in an OFF state. In the description made below, however, the description with respect to the state where both semiconductor chips are in an OFF state is omitted.

PATENT LITERATURE

PTL 1: PCT No. 2020/241239

SUMMARY OF INVENTION

Technical Problem

However, the semiconductor module having the current paths described above is merely obtained by simply performing the modularization of a current and hence, an effect of reducing a parasitic inductance is insufficient. This state is considered as a drawback of the above-mention semiconductor module.

The present invention has been made to overcome such drawbacks, and it is an object of the present invention to provide a semiconductor module that can realize the reduction of a parasitic inductance.

Solution to Problem

A semiconductor module according to the present invention includes: first to fourth semiconductor chips; first to fifth wiring patterns; a first power source terminal; one second power source terminal; the other second power source terminal; and a first intermediate point terminal and a second intermediate point terminal thus forming a bridge circuit in the semiconductor module, wherein, the bridge circuit is formed where the first semiconductor chip and the third semiconductor chip are chips disposed on a high side, and the second semiconductor chip and the fourth semiconductor chip form chips disposed on a low side, wherein the first semiconductor chip and the third semiconductor chip are disposed in symmetry with respect to a center line, the second semiconductor chip and the fourth semiconductor chip are disposed in symmetry with respect to the center line, the first wiring pattern and the third wiring pattern are disposed in symmetry with respect to the center line, and the second wiring pattern and the fourth wiring pattern are disposed in symmetry with respect to the center line, the first intermediate point terminal and the second intermediate point terminal are disposed in symmetry with respect to the center line, and one second power source terminal and the other second power source terminal are disposed in symmetry with respect to the center line, the fifth wiring pattern and the first power source terminal are respectively disposed in symmetry with respect to the center line, the first intermediate point terminal and the second intermediate point terminal are disposed adjacently to each other on one side of the semiconductor module, the first power source terminal, one second power source terminal and the other second power source terminal are disposed on the other side of the semiconductor module, and the first power source terminal is disposed in a space above the fifth wiring pattern in a non-contact state and connects the first wiring pattern and the third wiring pattern to each other.

Advantageous Effect of the Present Invention

In the semiconductor device according to the present invention, the first semiconductor chip and the third semiconductor chip are disposed in symmetry with respect to the center line, the second semiconductor chip and the fourth semiconductor chip are disposed in symmetry with respect to the center line, the first wiring pattern and the third wiring pattern are disposed in symmetry with respect to the center line, and the second wiring pattern and the fourth wiring pattern are disposed in symmetry with respect to the center line, the first intermediate point terminal and the second intermediate point terminal are disposed in symmetry with respect to the center line, and one second power source terminal and the other second power source terminal are disposed in symmetry with respect to the center line, and the fifth wiring pattern and the first power source terminal are respectively disposed in symmetry with respect to the center line. With such a configuration, according to the semiconductor module of the present invention, a length of the current path (wiring path length) when both the first semiconductor chip and the fourth semiconductor chip are turned on and a length of the current path (wiring path length) when both the third semiconductor chip and the second semiconductor chip are turned on can be set equal. As a result, a parasitic inductance of the current path (wiring) generated when both the first semiconductor chip and the fourth semiconductor chip are turned on and a parasitic inductance of the current path (wiring) generated when both the third semiconductor chip and the second semiconductor chip are turned on can be set equal. As a result, the parasitic inductance can be reduced.

Further, in the semiconductor module according to the present invention, the first intermediate point terminal and the second intermediate point terminal are disposed in symmetry with respect to the center line, one second power source terminal and the other second power source terminal are disposed in symmetry with respect to the center line, the fifth wiring pattern and the first power source terminal are respectively disposed in symmetry with respect to the center line, the first intermediate point terminal and the second intermediate point terminal are disposed adjacently to each other on one side of the semiconductor module, the first power source terminal, one second power source terminal and the other second power source terminal are disposed on the other side of the semiconductor module, and the first power source terminal is disposed in a space above the fifth wiring pattern in a non-contact state and connects the first wiring pattern and the third wiring pattern to each other. With such a configuration, according to the module of the present invention, the current path when both the first semiconductor chip and the fourth semiconductor chip are turned on flows the first semiconductor from the first power source terminal and reaches the first intermediate point terminal, flows through a load not illustrated in the drawing from the first intermediate point terminal and, thereafter, flows into the fifth wiring pattern from the second intermediate point terminal through the fourth semiconductor chip and, thereafter, reaches one second power source terminal and the other second power source terminal. On the other hand, the current path when both the third semiconductor chip and the second semiconductor chip are turned on flows through the third semiconductor chip from the first power source terminal and reaches the second intermediate point terminal, flows through a load not illustrated in the drawing from the second intermediate point terminal and, thereafter, flows into the fifth wiring pattern from the second intermediate point terminal through the second semiconductor chip and, thereafter, reaches one second power source terminal and the other second power source terminal. Accordingly, in both cases described above, currents flow in opposite directions between the first power source terminal and the fifth wiring pattern and, at the same time, currents flow in opposite directions between the first intermediate point terminal and the second intermediate point terminal. As a result, a magnetic field that is generated in the first power source terminal and the fifth wiring pattern and a magnetic field that is generated in the first intermediate point terminal and the second intermediate point terminal cancel each other whereby a parasitic inductance can be reduced.

DESCRIPTION OF EMBODIMENTS

Hereinafter, an embodiment of a semiconductor module according to the present invention is described.

Figure 1:
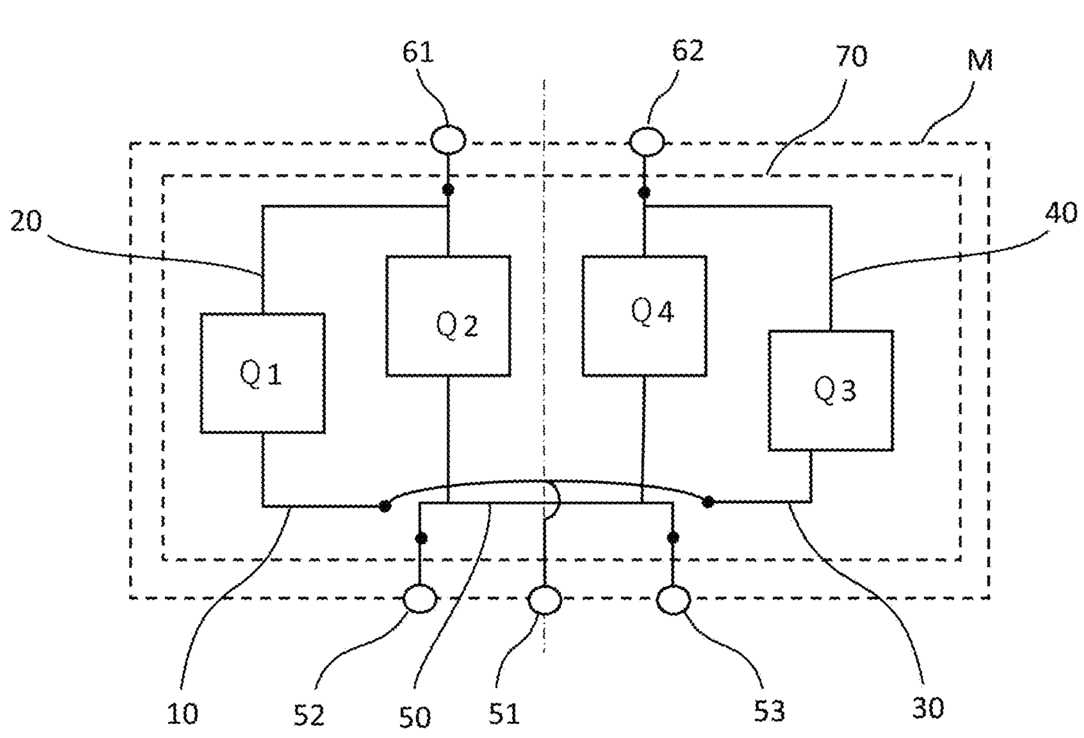
FIG. 1 is a schematic view of a semiconductor module 1 according to an embodiment.
Figure 2:
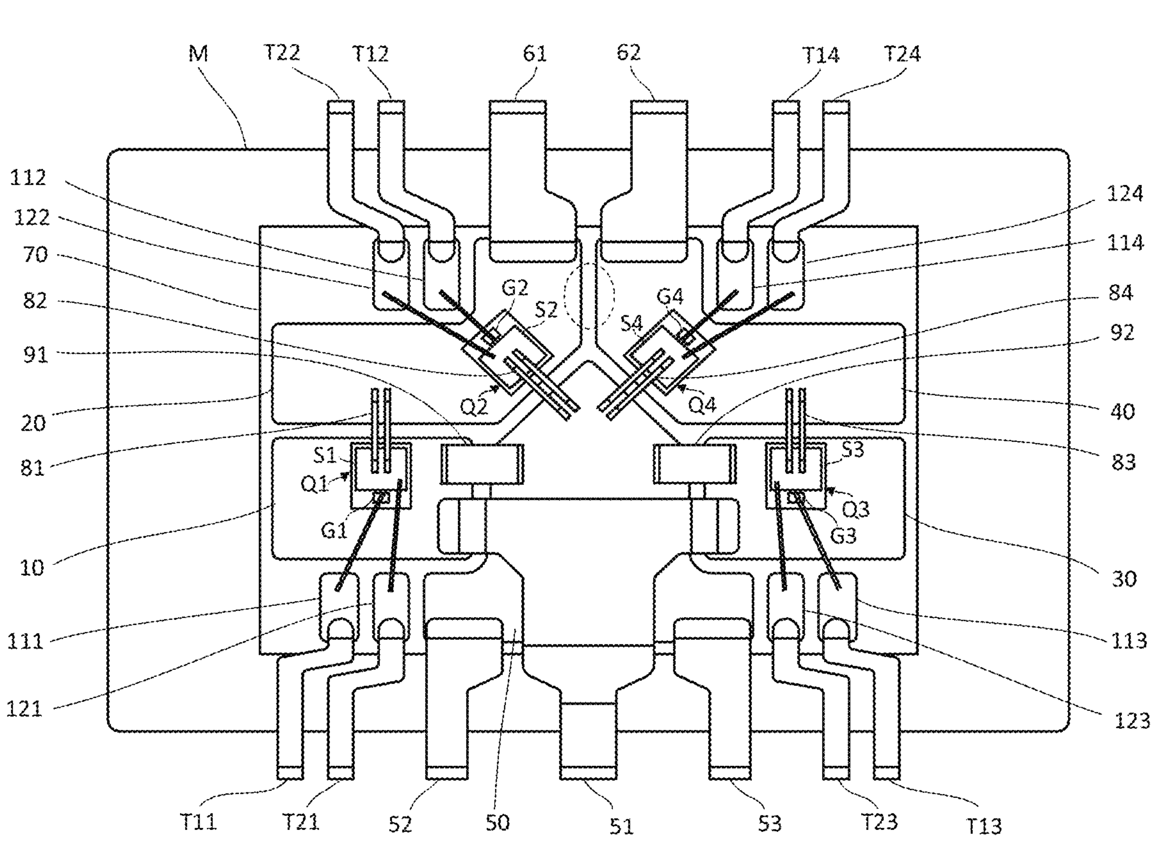
FIG. 2 is a plan view illustrating the internal configuration of the semiconductor module 1 according to the embodiment.
Figure 3:
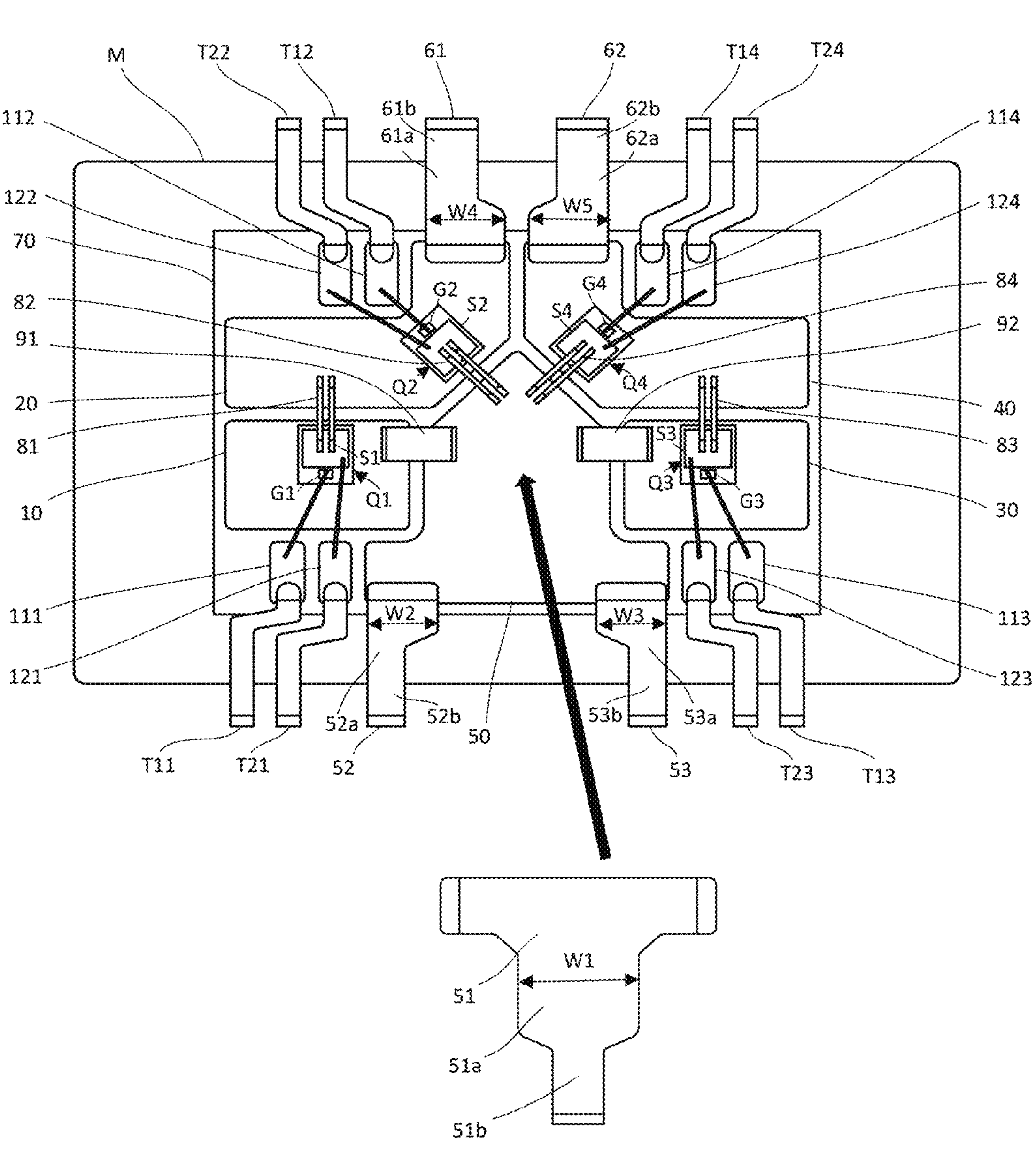
FIG. 3 is a plan view illustrating a state where a first power source terminal 51 is separated from the semiconductor module 1 according to the embodiment.
Figure 4:
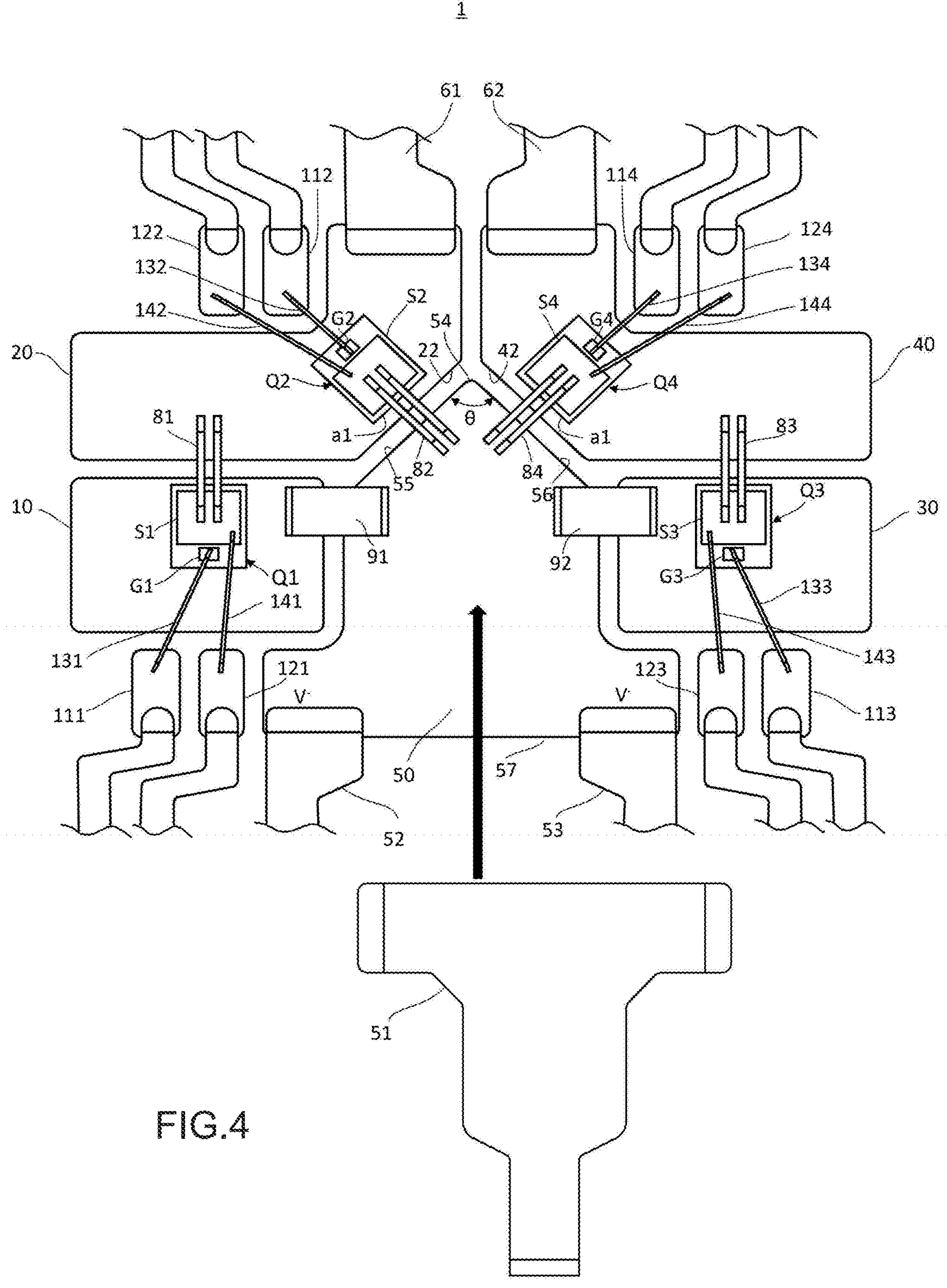
FIG. 4 is a main part enlarged view illustrating a main part in FIG. 3 in an enlarged manner.
Figure 5:
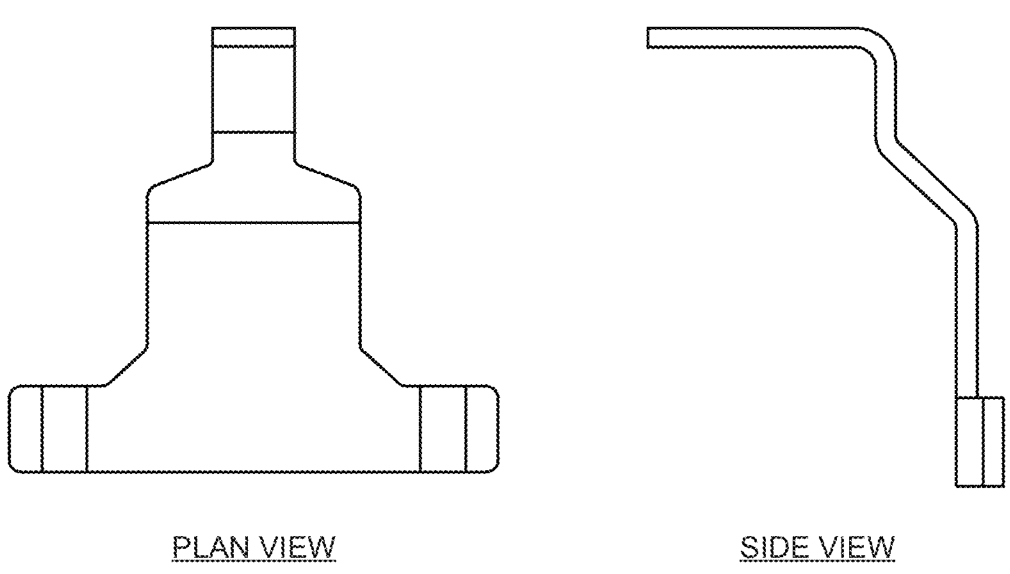
FIG. 5 is an explanatory view of the first power source terminal 51.
Figure 5:
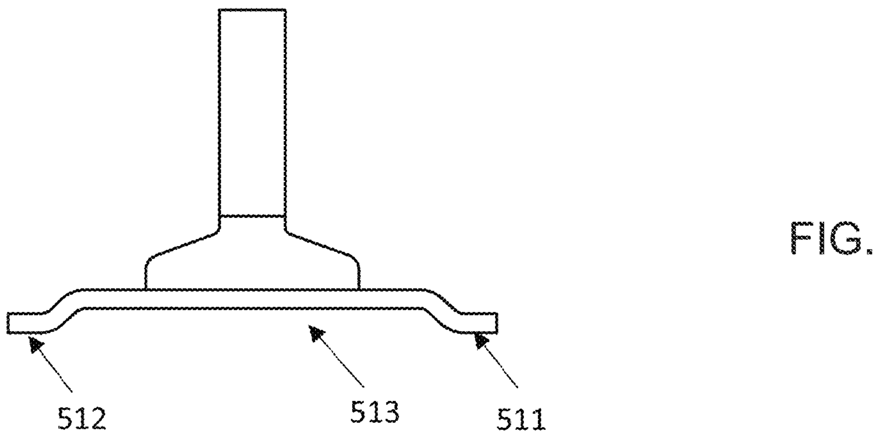

FIG. 1 is a conceptual view of a semiconductor module 1 according to the embodiment. The conceptual view of FIG. 1 is a view illustrating a general concept of the present invention. That is, FIG. 1 is a view illustrating constitutional elements (members) that constitutes main current paths (current paths thorough which a relatively large current flows excluding current paths for a control system and a detection system), wherein black dots in FIG. 1 indicate points where the constitutional elements are separated so as to form different constitutional elements. FIG. 2 is a plan view illustrating the internal configuration of the semiconductor module 1 according to the embodiment. FIG. 3 is a plan view illustrating a state where a first power source terminal 51 is separated from the semiconductor module 1 according to the embodiment. FIG. 4 is a main part enlarged view of a main part in FIG. 3. FIG. 5 is an explanatory view of the first power source terminal 51.

Hereinafter, the semiconductor module 1 according to the embodiment is described with reference to FIG. 1 to FIG. 5.

The semiconductor module 1 according to the embodiment is a DC-DC convertor. As illustrated in FIG. 1 to FIG. 4, the semiconductor module 1 according to the embodiment includes first to fourth semiconductor chips Q1 to Q4, first to fifth wiring patterns 10 to 50, the first power source terminal 51, one second power source terminal 52, the other second power source terminal 53, a first intermediate point terminal 61 and a second intermediate point terminal 62. The first semiconductor chip Q1 and the third semiconductor chip Q3 are chips disposed on a high side, and the second semiconductor chip Q2 and the fourth semiconductor chip Q4 are chips disposed on a low side thus forming a bridge circuit. The first power source terminal 51, one second power source terminal 52 and the other second power source terminal 53 function as input power source terminals, and the first intermediate point terminal 61 and the second intermediate point terminal 62 function as output power source terminals. In such a bridge circuit, an operation that turns on the first semiconductor chip Q1 and the fourth semiconductor chip Q4, and an operation that operates both the third semiconductor chip Q3 and the second semiconductor chip Q2 are alternately repeated. The bridge circuit is formed on a substrate 70. The semiconductor module 1 is sealed by a resin, and a mold M indicates an outer edge of the semiconductor module 1.

In the semiconductor module 1 according to the embodiment, as illustrated in FIG. 2 to FIG. 4, the first semiconductor chip Q1 and the third semiconductor chip Q3 are disposed in symmetry with respect to a center line. The second semiconductor chip Q2 and the fourth semiconductor chip Q4 are disposed in symmetry with respect to the center line. The first wiring pattern 10 and the third wiring pattern 30 are disposed in symmetry with respect to the center line. The second wiring pattern 20 and the fourth wiring pattern 40 are disposed in symmetry with respect to the center line. The first intermediate point terminal 61 and the second intermediate point terminal 62 are disposed in symmetry with respect to the center line. One second power source terminal 52 and the other second power source terminal 53 are disposed in symmetry with respect to the center line. The fifth wiring pattern 50 and the first power source terminal 51 are disposed (formed) in symmetry with respect to the center line.

In the semiconductor module 1 according to the embodiment, as illustrated in FIG. 2 to FIG. 4, the first intermediate point terminal 61 and the second intermediate point terminal 62 are disposed adjacently to each other on one side of the semiconductor module 1, and the first power source terminal 51, one second power source terminal 52 and the other second power source terminal 53 are disposed on the other side of the semiconductor module 1, the first power source terminal 51 is disposed in a space above the fifth wiring pattern 50 in a non-contact state and connects the first wiring pattern 10 and the third wiring pattern 30 to each other.

In the semiconductor module 1 according to the embodiment, as illustrated in FIG. 2 to FIG. 4, the first to fourth semiconductor chip Q1 to Q4 is constituted of the first semiconductor chip Q1, the second semiconductor chip Q2, the third semiconductor chip Q3, and the fourth semiconductor chip Q4. Further, the first to fifth wiring pattern 10 to 50 are constituted of the first wiring pattern 10, the second wiring pattern 20, the third wiring pattern 30, the fourth wiring pattern 40 and the fifth wiring pattern 50. Further, in the description made hereinafter, in a case where the first to fourth semiconductor chips Q1 to Q4 are collectively described, "first", "second" and the like is may be omitted and may be also expressed as "semiconductor chips Q1 to Q4". Also, with respect to the first to fifth wiring patterns 10 to 50, in a case where the first to fifth wiring patterns 10 to 50 are described in a collective manner, "first", "second" and the like may be omitted and may be expressed as "wiring patterns 10 to 50".

In the semiconductor module 1 according to the embodiment, the description is made by assuming the semiconductor chips Q1 to Q4 are each formed of a metal oxide semiconductor field effect transistor (MOSFET), and have a rectangular shape in a plan view. Further, in the semiconductor module 1 according to the embodiment, assume that on a direct copper bonding (DCB) substrate 70 that is formed by directly bonding metal (copper) to a base made of ceramic (alumina, aluminum nitride, silicon nitride or the like), the wiring patterns 10 to 50 are formed. The substrate used in the semiconductor module of the present invention is not limited to the DCB substrate, and other ceramic substrates such as an active metal brazing (AMB) substrate, a metal base substrate such as a copper base or an aluminum base and the like can be also used. As metal bonded to the ceramic substrate, metal other than copper (for example, aluminum) can be also used.

The semiconductor chips Q1 to Q4 each include a source electrode S, a drain electrode D, and a gate electrode G. The drain electrode D in a case where a vertical transistor chip (a vertical transistor chip such as a MOSFET or the like formed using Si or SiC material) is used as the semiconductor chips Q1 to Q4, is formed on a surface of the semiconductor chips Q1 to Q4 on surfaces of wiring patterns 10 to 40 side (a back surfaces of semiconductor chips Q1 to Q4). In the semiconductor module 1 according to the embodiment, the case is exemplified where the vertical transistor chip is used as the semiconductor chips Q1 to Q4. Accordingly, the drain electrodes D are disposed on the wiring patterns 10 to 40 side and hence, the drain electrodes D cannot be visually recognized thereby a symbol "D" that indicates the drain electrodes are not illustrated. Further, the gate electrode G is disposed on a surface each of the semiconductor chips Q1 to Q4 on a source electrode S side.

Further, the semiconductor chips Q1 to Q4 are suitably changeable within a range that the gist of the present invention is not changed. For example, as the semiconductor chips Q1 to Q4, for example, a lateral-type transistor chip (for example, a GaN-HEMT made of a GaN on Si material, or a compound semiconductor transistor made of a $Ga_2O_3$ on Si material or the like) may be also used. In the case of the lateral-type transistor chip, it is preferable that gate electrodes G and source electrodes S may preferably be formed in plurals on a surface of the semiconductor chip including the drain electrode D. Further, semiconductor chips Q1 to Q4 are not limited to a transistor chip, may have a modified configuration where a transistor chip is replaced with a diode chip corresponding to a circuit application.

In the semiconductor module 1 according to the embodiment, as illustrated in FIG. 2 to FIG. 4, the second wiring pattern 20 and the fourth wiring pattern 40 are disposed such that the second wiring pattern 20 includes a neighboring region to which the first intermediate point terminal 61 is connected, the fourth wiring pattern 40 includes a neighboring region to which the second intermediate point terminal 62 is connected, and the neighboring regions are disposed adjacently to each other.

In the semiconductor module 1 according to the embodiment, as illustrated in FIG. 2 to FIG. 4, the first wiring pattern 10 and the third wiring pattern 30 are disposed adjacently to both sides of the fifth wiring pattern 50 (a second portion described later), and one second power source terminal 52 and the other second power source terminal 53 are disposed on both sides of the fifth wiring pattern 50 (a first portion described later), and the first power source terminal 51 has a T-shape.

As described in FIG. 2 to FIG. 4, the semiconductor module 1 according to the embodiment includes: a first decoupling capacitor 91 that is disposed in the vicinity of the first semiconductor chip Q1 and the second semiconductor chip Q2 and is connected to the first wiring pattern 10 and the fifth wiring pattern 50; and a second decoupling capacitor 92 that is disposed in the vicinity of the third semiconductor chip Q3 and the fourth semiconductor chip Q4 and are connected to the third wiring pattern 30 and the fifth wiring pattern 50. The first decoupling capacitor 91 and the second decoupling capacitor 92 have a function of avoiding a change in power source voltage and removing various noises.

In the semiconductor module 1 according to the embodiment, as illustrated in FIG. 2 to FIG. 4, the fifth wiring pattern 50 is disposed at a center portion of the semiconductor module 1 as viewed in a plan view. The fifth wiring pattern 50 includes: the first portion which is positioned on the other side of the semiconductor module 1, and to which one second power source terminal 52 and the other second power source terminal 53 are connected; a second portion which is positioned between the first wiring pattern 10 and the third wiring pattern 30; and a third portion that protrudes toward one side of semiconductor module 1 from the second portion. A tapered protruding portion 54 having a first oblique side 55 and a second oblique side 56 is formed on the third portion.

The term "tapered" may be omitted from the phrase "tapered protruding portion 54" so that "tapered protruding portion 54" may be referred as "protruding portion 54". Although an angle θ (see FIG. 4) made between the first oblique side 55 and the second oblique side 56 of the protruding portion 54 is not specifically limited, the angle θ is set to 90 degrees in the semiconductor module 1 according to the embodiment. Accordingly, an angle of the oblique side 22 of the second wiring pattern 20 and an angle of the oblique side 42 of the fourth wiring pattern 40 are 45 degrees respectively.

In the semiconductor module 1 according to the embodiment, the first semiconductor chip Q1 includes, as illustrated in FIG. 2 to FIG. 4, a first gate electrode G1, a first source electrode S1 and a first drain electrode. The first gate electrode G1 is connected to a first control terminal T11 via a first control connection member 131 made of an aluminum wire or the like and a first control wiring pattern 111. The first source electrode S1 is connected to a first detection terminal T21 via a first detection connection member 141 made of an aluminum wire or the like and a first detection wiring pattern 121, and is also connected to the second wiring pattern 20 via a first connection member 81 made of an aluminum wire or the like. The first drain electrode is connected to the first wiring pattern 10.

In the semiconductor module 1 according to the embodiment, the second semiconductor chip Q2 includes, as illustrated in FIG. 2 to FIG. 4, a second gate electrode G2, a second source electrode S2 and a second drain electrode. The second gate electrode G2 is connected to a second control terminal T12 via a second control connection member 132 made of an aluminum wire or the like and a second control wiring pattern 112. The second source electrode S2 is connected to a second detection terminal T22 via a second detection connection member 142 made of an aluminum wire or the like and a second detection wiring pattern 122, and is also connected to the fifth wiring pattern 50 via a second connection member 82 made of an aluminum wire or the like. The second drain electrode is connected to the second wiring pattern 20.

In the semiconductor module 1 according to the embodiment, the third semiconductor chip Q3 includes, as illustrated in FIG. 2 to FIG. 4, a third gate electrode G3, a third source electrode S3 and a third drain electrode. The third gate electrode G3 is connected to a third control terminal T13 via a third control connection member 133 made of an aluminum wire or the like and a third control wiring pattern 113. The third source electrode S3 is connected to a third detection terminal T23 via a third detection connection member 143 made of an aluminum wire or the like and a third detection wiring pattern 123, and is also connected to the fourth wiring pattern 40 via a third connection member 83 made of an aluminum wire or the like. The third drain electrode is connected to the third wiring pattern 30.

In the semiconductor module 1 according to the embodiment, the fourth semiconductor chip Q4 includes a fourth gate electrode G4, a fourth source electrode S4 and a fourth drain electrode. The fourth gate electrode G4 is connected to a fourth control terminal T14 via a fourth control connection member 134 made of an aluminum wire or the like and a fourth control wiring pattern 114. The fourth source electrode S4 is connected to a fourth detection terminal T24 via a fourth detection connection member 144 made of an aluminum wire or the like and a fourth detection wiring pattern 124, and is also connected to the fifth wiring pattern 50 via a fourth connection member 84 made of an aluminum wire or the like. The fourth drain electrode is connected to the fourth wiring pattern 40.

In the semiconductor module 1 according to the embodiment 1, as illustrated in FIG. 2 to FIG. 4, an oblique side that follows the first oblique side 55 of the fifth wiring pattern 50 is formed on the second wiring pattern 20, and an oblique side that follows the second oblique side 56 of the fifth wiring pattern 50 is formed on the fourth wiring pattern 40.

In the semiconductor module 1 according to the embodiment, as illustrated in FIG. 2 to FIG. 4, the second semiconductor chip Q2 is configured such that, assuming one side out of a plurality of sides of the second semiconductor chip Q2 as a first side a1 of the second semiconductor chip Q2, the first side a1 of the second semiconductor chip Q2 is disposed along the first oblique side 55 of the fifth wiring pattern 50, and the source electrode S2 of the second semiconductor chip Q2 is connected to the fifth wiring pattern 50 via the second connection member 82.

Further, in the semiconductor module 1 according to the embodiment, as illustrated in FIG. 2 to FIG. 4, the fourth semiconductor chip Q4 is configured such that, assuming one side out of a plurality of sides of the fourth semiconductor chip Q4 as a first side a1 of the fourth semiconductor chip Q4, the first side a1 of the fourth semiconductor chip Q4 is disposed along the second oblique side 56 of the fifth wiring pattern 50, and the source electrode S4 of the fourth semiconductor chip Q4 is connected to the fifth wiring pattern 50 via the fourth connection member 84.

In the semiconductor module 1 according to the embodiment, as illustrated in FIG. 2 to FIG. 4, the first power source terminal 51, one second power source terminal 52, the other second power source terminal 53, the first intermediate point terminal 61 and the second intermediate point terminal 62 are formed such that a width of each of inner lead portions 51*a*, 52*a*, 53*a*, 61*a*, 62*a* thereof is set wider than a width of each of outer lead portions 51*b*, 52*b*, 53*b*, 61*b*, 62*b* thereof.

The description is made with respect to the first power source terminal 51, one and the other second power source terminals 52, 53, and the first and second intermediate point terminals 61, 62. The first power source terminal 51 and one and the other second power source terminals 52, 53 are terminals that supply electricity to the bridge circuit. To consider these components from a viewpoint of a current, assume the first power source terminal 51 as an input side of a current, and one and the other second power source terminals 52, 53 as an output side of the current.

The first power source terminal 51 is connected to the first wiring pattern 10 and the third wiring pattern 30. One and the other second power source terminals 52, 53 are connected to the fifth wiring pattern 50 (both side portions).

The first intermediate point terminal 61 and the second intermediate point terminal 62 are terminals that are connected to the load not illustrated in the drawings. The first intermediate point terminal 61 is connected to the second wiring pattern 20, and the second intermediate point terminal 62 is connected to the fourth wiring pattern 40. In such a configuration, the directions of currents that flow with respect to the first intermediate point terminal 61 and the second intermediate point terminal 62 become opposite (are inverted) between when both the first semiconductor chip Q1 and the fourth semiconductor chip Q4 are turned on and when both the third semiconductor chip Q3 and the second semiconductor chip Q2 are turned on.

In the semiconductor module 1 according to the embodiment, when both the first semiconductor chip Q1 and the fourth semiconductor chip Q4 are turned on, a current flows from the first intermediate point terminal 61 to the second intermediate point terminal 62. On the other hand, when both the third semiconductor chip Q3 and the second semiconductor chip Q2 are turned on, a current flows from the second intermediate point terminal 62 to the first intermediate point terminal 61. The overall current path in the semiconductor module 1 according to the embodiment is described later.

Further, as illustrated in FIG. 2 to FIG. 4, the outer lead portion of the first power source terminal 51, the outer lead portion of one second power source terminal 52 and the outer lead portion of the other second power source terminal 53, and the outer lead portion of the first intermediate point terminal 61 and the outer lead portion of the second intermediate point terminal 62 are disposed on opposite sides of the semiconductor module 1. In such a configuration, "opposite sides of the semiconductor module 1" means an upper side of the semiconductor module 1 illustrated in the drawing and a lower side of the semiconductor module 1 illustrated in the drawing. Further, the outer lead portion means a portion existing outside a resin when resin sealing is made. In the semiconductor module 1 according to the embodiment 1, resin sealing is made. However, in FIG. 2 and FIG. 3, only an outer edge indicated by symbol M is displayed with respect to the resin for illustrating the internal configuration of the semiconductor module 1.

As illustrated in FIG. 2 to FIG. 4, an outer lead portion of the first control terminal T11 and the outer lead portion of the third control terminal T13, an outer lead portion of the first power source terminal 51, an outer lead portion of one second power source terminal 52 and an outer lead portion of the other second power source terminal 53 are disposed on the same side of the semiconductor module 1. An outer lead portion of the second control terminal T12 and an outer lead portion of the fourth control terminal T14, an outer lead portion of the first intermediate point terminal 61 and an outer lead portion of the second intermediate point terminal 62 are disposed on the same side of the semiconductor module 1.

Further, as illustrated in FIG. 2 to FIG. 4, an outer lead portion of the first detection terminal T21 and an outer lead portion of the third detection terminal T23, an outer lead portion of the first power source terminal 51, and an outer lead portion of one second power source terminal 52 and an outer lead portion of the other second power source terminal 53 are arrange on the same side of the semiconductor module 1. Further, an outer lead portion of the second detection terminal T22 and an outer lead portion of the fourth detection terminal T24, an outer lead portion of the first intermediate point terminal 61 and an outer lead portion of the second intermediate point terminal 62 are disposed on the same side of the semiconductor module 1.

As illustrated in FIG. 5 that is a front view, the first power source terminal 51 includes: a connection portion 511 that is connected with the first wiring pattern 10; a connection portion 512 that is connected with the third wiring pattern 30; and a space forming portion 513 that is positioned between the connection portion 511 with the first wiring pattern 10 and the connection portion 512 with the third wiring pattern 30, and forms a space between the space forming portion 513 and the fifth wiring pattern 50. With such a configuration, in the semiconductor module 1 according to the embodiment, as can be also understood in FIG. 2 to FIG. 5, the first power source terminal 51 is disposed in a space above the fifth wiring pattern 50 in a non-contact state, and, connects the first wiring pattern 10 and the third wiring pattern 30 to each other.

Figure 6:
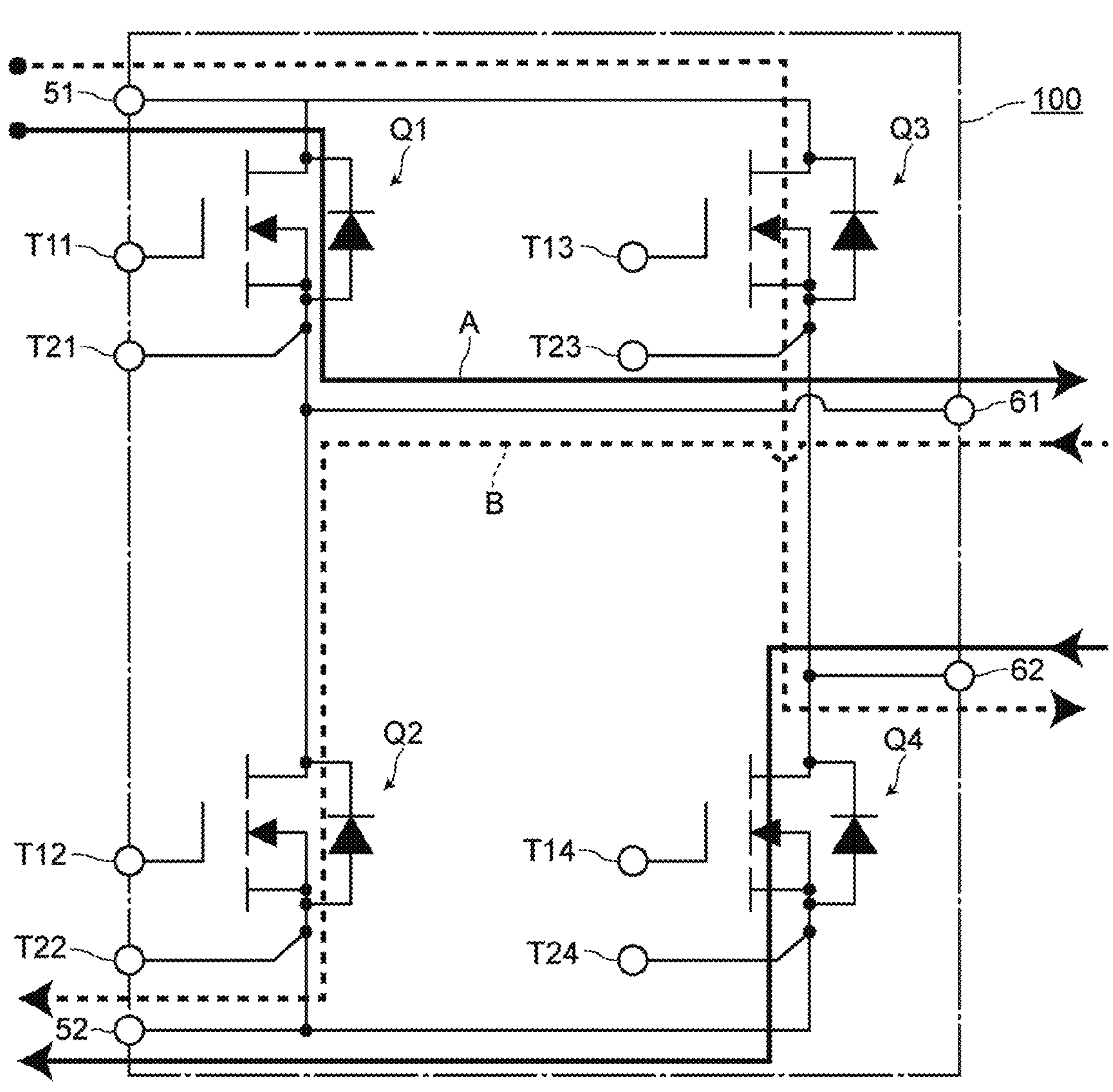
FIG. 6 is an equivalent circuit diagram of the semiconductor module 1 according to the embodiment.
Figure 7:
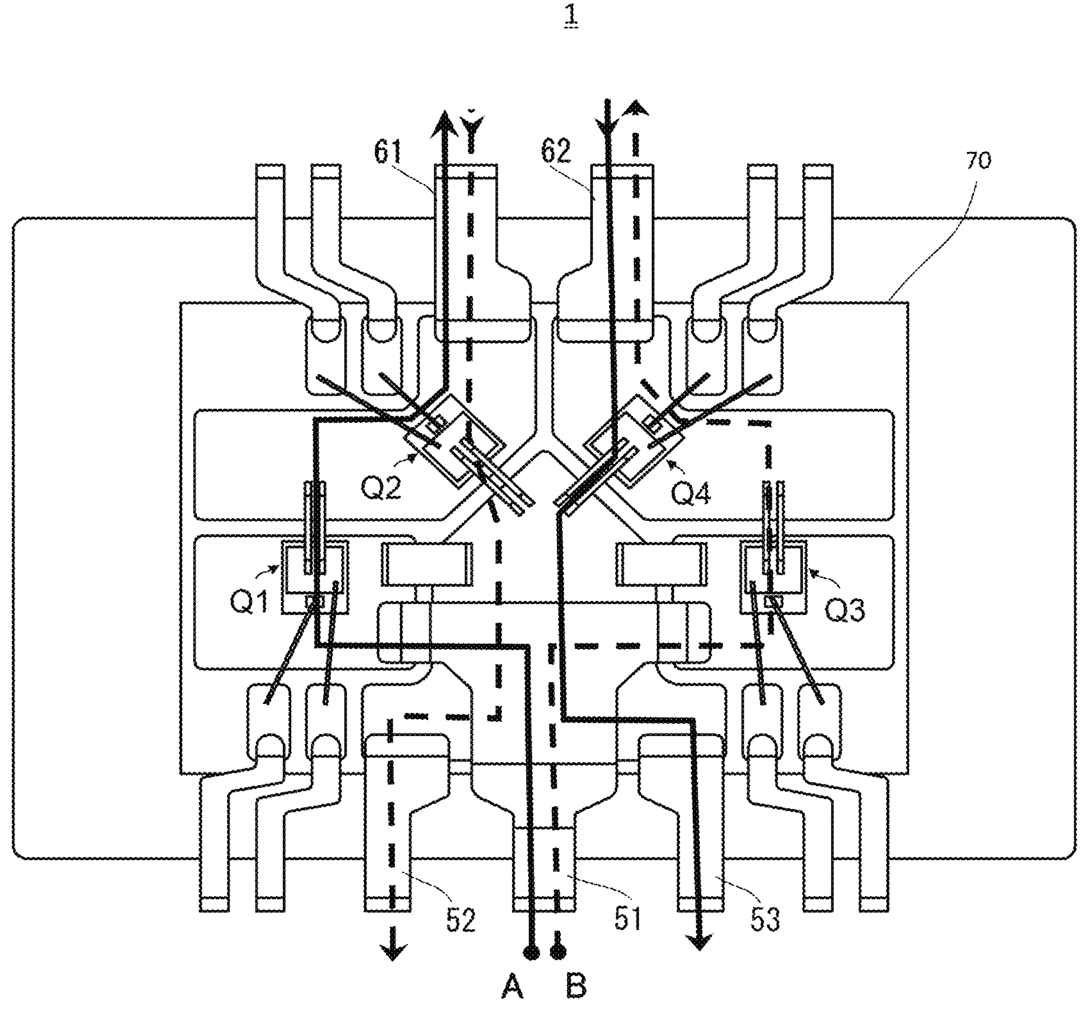
FIG. 7 is a current path explanatory view obtained by writing current paths in the plan view that is FIG. 2.

FIG. 6 is an equivalent circuit diagram of the bridge circuit 100 of the semiconductor module 1 illustrated in FIG. 2. FIG. 7 is a current path explanatory view prepared by writing current paths in the plan view that is FIG. 2.

In FIG. 6 and FIG. 7, the constitutional elements identical to the constitutional elements illustrated in FIG. 2 are given the same symbols. However, in FIG. 6, one second power source terminal 52 and the other second power source terminal 53 are collectively expressed as the second power source terminal 52, and also in the description made hereinafter, one second power source terminal 52 and the other second power source terminal 53 are collectively referred to as the second power source terminal 52.

The bridge circuit 100 illustrated in FIG. 6 is, as described previously, the bridge circuit where the first semiconductor chip Q1 and the third semiconductor chip Q3 are chips disposed on the high side, and the second semiconductor chip Q2 and the fourth semiconductor chip Q4 are chips disposed on the low side. In such a bridge circuit 100, by simultaneously applying a predetermined voltage to the respective gate electrodes G (gate electrodes G1, G4) of the first semiconductor chip Q1 and the fourth semiconductor chip Q4, both the first semiconductor chip Q1 and the fourth semiconductor chip Q4 are turned on. Further, by simultaneously applying a predetermined voltage to the respective gate electrodes G (gate electrodes G3, G2) of the third semiconductor chip Q3 and the second semiconductor chip Q2, both the third semiconductor chip Q3 and the second semiconductor chip Q2 are turned on.

In such a bridge circuit 100, a current path when both the first semiconductor chip Q1 and the fourth semiconductor chip Q4 are turned on is, as indicated by a solid line A in FIG. 6, a path where a current flows from the first power source terminal 51, flows through the first semiconductor chip Q1 and reaches the first intermediate point terminal 61 and, after flowing through a load not illustrated in the drawing from the first intermediate point terminal 61, flows from the second intermediate point terminal 62, flows through the fourth semiconductor chip Q4 and reaches the second power source terminal 52.

On the other hand, a current path when both the third semiconductor chip Q3 and the second semiconductor chip Q2 are turned on is, as indicated by a broken line B in FIG. 6, a path where a current flows from the first power source terminal 51, flows through the third semiconductor chip Q3 and reaches the second intermediate point terminal 62 and, after flowing through the load not illustrated in the drawing from the second intermediate point terminal 62, flows from the first intermediate point terminal 61, flows through the second semiconductor chip Q2 and reaches the second power source terminal 52.

Such current paths are described specifically with reference to FIG. 7 that is an explanatory view of current paths of the semiconductor module 1 according to the embodiment. FIG. 7 is a view prepared by adding current paths to the plan view that is FIG. 2. However, in FIG. 7, some of symbols indicating the respective constitutional elements illustrated in FIG. 2 are omitted, and symbols of the constitutional elements mainly necessary for the description of the current paths are indicated.

The current path when both the first semiconductor chip Q1 and the fourth semiconductor chip Q4 are turned on forms a path indicated by a solid line A in FIG. 7. Specifically, a current from the first power source terminal 51 enters the first wiring pattern 10, and flows from the drain electrode of the first semiconductor chip Q1 mounted on the first wiring pattern 10 and through the source electrode S1 of the first semiconductor chip Q1, and flows to the first intermediate point terminal 61 through the second wiring pattern 20 via the first connection member 81 that connects the source electrode S1 and the second wiring pattern 20. Then, the current enters the fourth wiring pattern 40 from the second intermediate point terminal 62 via the load not illustrated in the drawing, the current flows to the second power source terminal 52 (one second power source terminal 52 and the other second power source terminal 53) in a state where the current flows to the source electrode S4 from the drain electrode of the fourth semiconductor chip Q4 mounted on the fourth wiring pattern 40, and flows through the fifth wiring pattern 50 via the fourth connection member 84 that connects the source electrode S4 and the fifth wiring pattern 50.

On the other hand, the current path when both the third semiconductor chip Q3 and the second semiconductor chip Q2 are turned on forms a path indicated by a broken line B in FIG. 7. Specifically, a current from the first power source terminal 51 enters the third wiring pattern 30, and flows from the drain electrode of the third semiconductor chip Q3 mounted on the third wiring pattern 30 and through the source electrode S3 of the third semiconductor chip Q3, and flows to the second intermediate point terminal 62 through the fourth wiring pattern 40 via the third connection member 83 that connects the source electrode S3 and the fourth wiring pattern 40. Then, the current enters the second wiring pattern 20 from the first intermediate point terminal 61 via the load not illustrated in the drawing, and flows through the source electrode S2 from the drain electrode of the second semiconductor chip Q2 mounted on the second wiring pattern 20 and flows to the second power source terminal 52 (one second power source terminal 52 and the other second power source terminal 53) through the fifth wiring pattern 50 from the second connection member 82 that connects the source electrode S2 and the fifth wiring pattern 50.

In this manner, at the time of using the semiconductor module 1, currents flow in opposite directions between the first power source terminal 51 and the second power source terminal 52 (one second power source terminal 52 and the other second power source terminal 53) and, at the same time, currents flow in opposite directions between the first intermediate point terminal 61 and the second intermediate point terminal 62.

As has been described heretofore, in the semiconductor module 1 according to the embodiment, the first semiconductor chip Q1 and the third semiconductor chip Q3 are disposed in symmetry with respect to the center line, the second semiconductor chip Q2 and the fourth semiconductor chip Q4 are disposed in symmetry with respect to the center line, the first wiring pattern 10 and the third wiring pattern 30 are disposed in symmetry with respect to the center line, and the second wiring pattern 20 and the fourth wiring pattern 40 are disposed in symmetry with respect to the center line, the first intermediate point terminal 61 and the second intermediate point terminal 62 are disposed in symmetry with respect to the center line, and one second power source terminal 52 and the other second power source terminal 53 are disposed in symmetry with respect to the center line, and the fifth wiring pattern 50 and the first power source terminal 51 are respectively disposed in symmetry with respect to the center line. With such a configuration, according to the semiconductor module 1 of the embodiment, a length of the current path (wiring path length) when both the first semiconductor chip Q1 and the fourth semiconductor chip Q4 are turned on and a length of the current path (wiring path length) when both the third semiconductor chip Q3 and the second semiconductor chip Q2 are turned on can be set equal. As a result, a parasitic inductance of the current path (wiring) generated when both the first semiconductor chip Q1 and the fourth semiconductor chip Q4 are turned on and a parasitic inductance of the current path (wiring) generated when both the third semiconductor chip Q3 and the second semiconductor chip Q2 are turned on can be set equal. As a result, the parasitic inductance can be reduced.

Further, in the semiconductor module 1 according to the embodiment, the first intermediate point terminal 61 and the second intermediate point terminal 62 are disposed in symmetry with respect to the center line, one second power source terminal 52 and the other second power source terminal 53 are disposed in symmetry with respect to the center line, the fifth wiring pattern 50 and the first power source terminal 51 are respectively disposed in symmetry with respect to the center line, the first intermediate point terminal 61 and the second intermediate point terminal 62 are disposed adjacently to each other on one side of the semiconductor module 1, the first power source terminal 51, one second power source terminal 52 and the other second power source terminal 53 are disposed on the other side of the semiconductor module 1, and the first power source terminal 51 is disposed in a space above the fifth wiring pattern 50 in a non-contact state and connects the first wiring pattern 10 and the third wiring pattern 30 to each other. With such a configuration, according to the module 1 of the embodiment, the current path when both the first semiconductor chip Q1 and the fourth semiconductor chip Q4 are turned on flows through the first semiconductor chip Q1 from the first power source terminal 51 and reaches the first intermediate point terminal 61, flows through a load not illustrated in the drawing from the first intermediate point terminal 61 and, thereafter, flows into the fifth wiring pattern 50 from the second intermediate point terminal 62 through the fourth semiconductor chip Q4 and, thereafter, reaches one second power source terminal 52 and the other second power source terminal 53. On the other hand, the current path when both the third semiconductor chip Q3 and the second semiconductor chip Q2 are turned on flows through the third semiconductor chip Q3 from the first power source terminal 51 and reaches the second intermediate point terminal 62, flows through a load not illustrated in the drawing from the second intermediate point terminal 62 and, thereafter, flows into the fifth wiring pattern 50 from the second intermediate point terminal 62 through the second semiconductor chip Q2 and, thereafter, reaches one second power source terminal 52 and the other second power source terminal 53. Accordingly, in both cases described above, currents flow in opposite directions between the first power source terminal 51 and the fifth wiring pattern 50 and, at the same time, currents flow in opposite directions between the first intermediate point terminal 61 and the second intermediate point terminal 62. As a result, magnetic fields that are generated in the first power source terminal 51 and the fifth wiring pattern 50 and magnetic fields that are generated in the first intermediate point terminal 61 and the second intermediate point terminal 62 cancel each other whereby a parasitic inductance can be reduced.

As has been described heretofore, according to the semiconductor module 1 of the embodiment, it is possible to acquire an advantageous effect that a parasitic inductance can be reduced. To verify these advantageous effects, the inventors carried out a simulation. Hereinafter, a result of the simulation that the inventors carried out is described.

Figure 8:
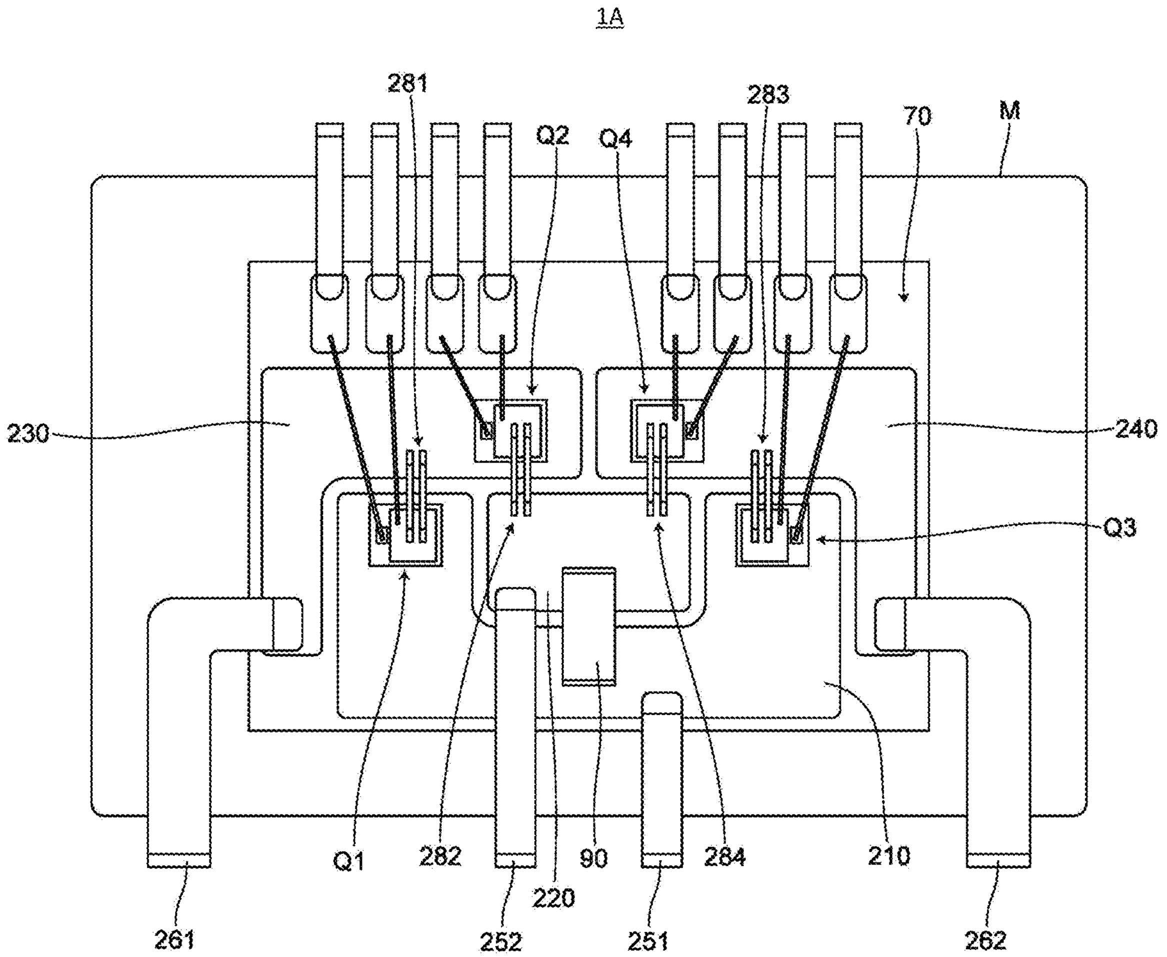
FIG. 8 is a plan view illustrating the internal configuration of a semiconductor module 1A according to a comparison example.

FIG. 8 is a plan view illustrating the configuration of a semiconductor module 1A prepared for a comparison with the semiconductor module 1 according to the embodiment. In the description made hereinafter, the semiconductor module 1A prepared for a comparison with the semiconductor module 1 according to the embodiment may also simply expressed as "semiconductor module 1A".

The semiconductor module 1A basically has substantially the same constitutional elements as the semiconductor module 1 according to the embodiment. In FIG. 8, with respect to the symbols indicating the constitutional elements of the semiconductor module 1A, the symbols necessary for the description are indicated. In the semiconductor module 1A, first to fourth wiring patterns 210 to 240 correspond to the first to fourth wiring patterns 10 to 40 in the semiconductor module 1 according to the embodiment, the first power source terminal 251 corresponds to the first power source terminal 51, the second power source terminal 252 corresponds to the second power sources (one and the other second power source terminals) 52, 53 in the semiconductor module 1 according to the embodiment, first and second intermediate point terminals 261, 262 correspond to the first and second intermediate point terminals 61, 62 in the semiconductor module 1 according to the embodiment, and first to fourth connection members 281 to 284 correspond to the first to fourth connection members 81 to 84 in the semiconductor module 1 according to the embodiment.

The first to fourth semiconductor chips Q1 to Q4 used in the semiconductor module 1 according to the embodiment are also used as the first to fourth semiconductor chips Q1 to Q4 in the semiconductor module 1A, and the substrate 70 in the semiconductor module 1 according to the embodiment is also used as the substrate 70 in the semiconductor module 1A. Further, also in such a configuration, in a case where the first to fourth semiconductor chips Q1 to Q4 are collectively described, these semiconductor chips Q1 to Q4 may be expressed as the semiconductor chips Q1 to Q4, and in a case where the first to fourth wiring patterns 210 to 240 are collectively described, these wiring patterns 210 to 240 may be also expressed as the wiring patterns 210 to 240.

The bridge circuit of the semiconductor module 1A has substantially the same configuration as the semiconductor module 1 according to the embodiment. That is, the bridge circuit of the semiconductor module 1A is a bridge circuit where the first semiconductor chip Q1 and the third semiconductor chip Q3 are disposed on a high side and the second semiconductor chip Q2 and the fourth semiconductor chip Q4 are disposed on a low side, wherein both the first semiconductor chip Q1 and the fourth semiconductor chip Q4 are turned on, and both the third semiconductor chip Q3 and the second semiconductor chip Q2 are turned on.

However, in the semiconductor module 1A, as can be understood from FIG. 8, the first power source terminal 251 is formed shorter than the second power source terminal 252. Accordingly, the semiconductor module 1A is configured such that it is possible to make only a portion of a magnetic field generated in the first power source terminal 251 and a portion of a magnetic field generated in the second power source terminal 252 cancel each other. Further, in the semiconductor module 1A, the first intermediate point terminal 261 and the first intermediate point terminal 262 are disposed on both sides of the substrate in a spaced-apart manner from each other. Accordingly, the semiconductor module 1A is basically configured such that a magnetic field generated in the first intermediate pint terminal 261 and a magnetic field generated in the second intermediate point terminal 262 cannot cancel each other.

Figure 9:
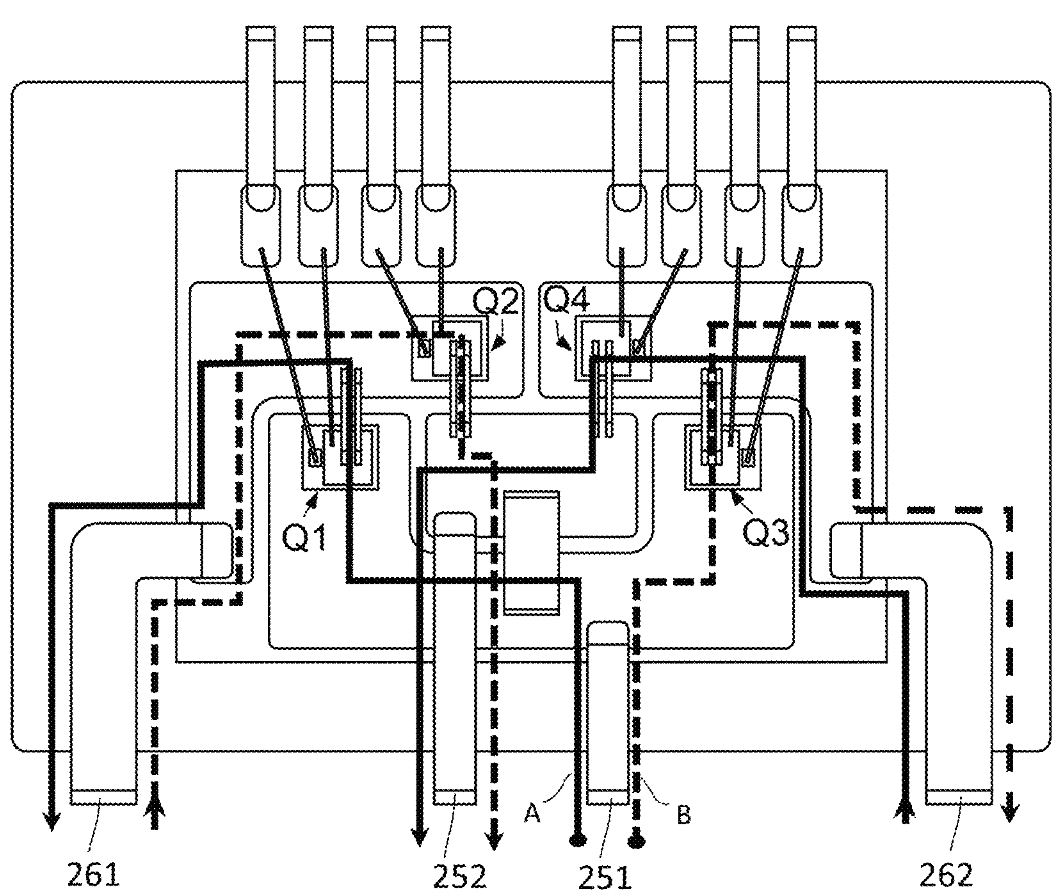
FIG. 9 is a current path explanatory view obtained by writing current paths in the plan view that is FIG. 8.

FIG. 9 is a view describing current paths of the semiconductor module 1A prepared for comparison. FIG. 9 is a view illustrating the configuration of the semiconductor module 1A obtained by adding the current paths to the semiconductor module 1A illustrated in FIG. 8. Accordingly, the semiconductor module 1A illustrated in FIG. 9 has substantially the same configuration as the semiconductor module 1A illustrated in FIG. 8. When both the first semiconductor chip Q1 and the fourth semiconductor chip Q4 are turned on, the current paths of the semiconductor module 1A become paths indicated by a solid line A in FIG. 9. On the other hand, when both the third semiconductor chip Q3 and the second semiconductor chip Q2 are turned on, the current paths of the semiconductor module 1A become paths indicated by a broken line B in FIG. 9.

Hereinafter, the description is made with respect to a result obtained by comparing, by simulation, a parasitic inductance generated in the semiconductor module 1 according to the embodiment and a parasitic inductance generated in the semiconductor module 1A. Here, assuming frequency of a turn on/off operation of the bridge circuit to a frequency within a range of 1 kHz to 1 GHz or above, a parasitic inductance that was generated in the current paths when the first semiconductor chip Q1 and the fourth semiconductor chip Q4 were turned on, and a parasitic inductance that was in the current paths when the third semiconductor chip Q3 and the semiconductor chip Q2 were turned on were measured.

Figure 10:
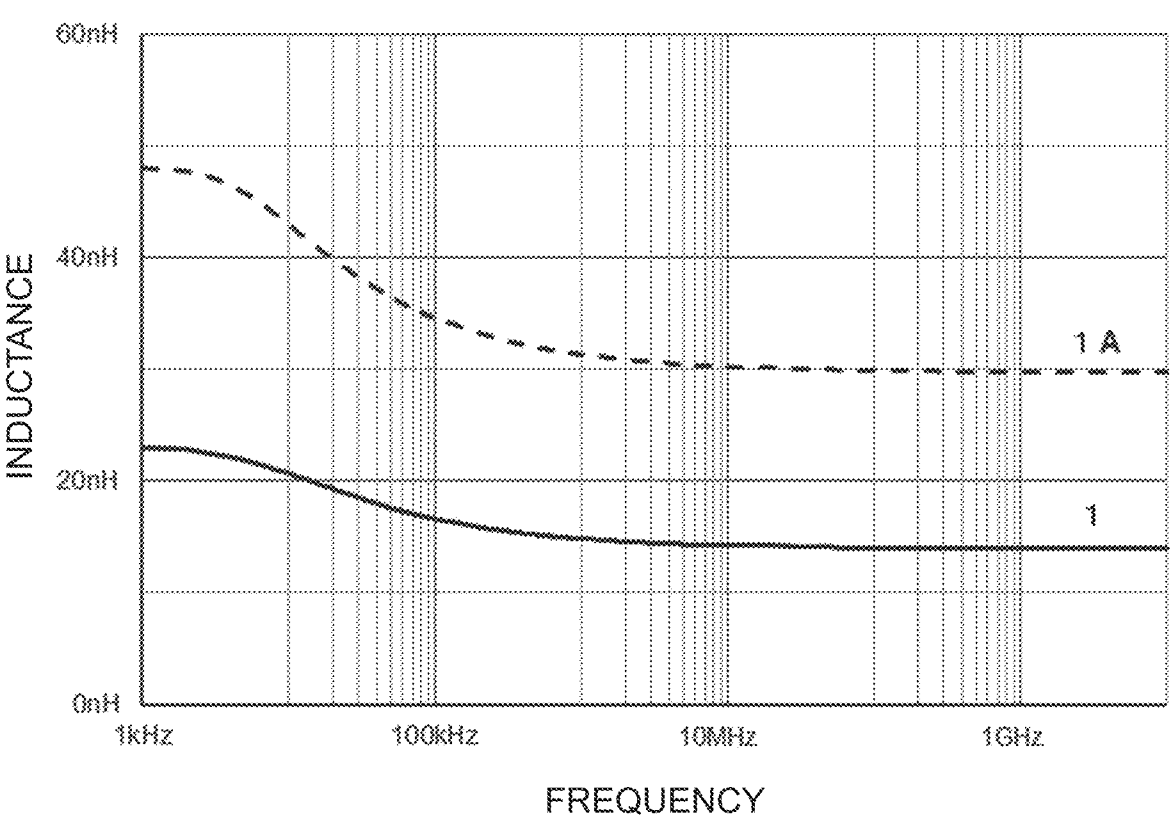
FIG. 10 is a view illustrating the relationship between frequency and inductance with respect to the semiconductor module 1 according to the embodiment and semiconductor module 1A according to the comparison example.

FIG. 10 is a graph illustrating a relationship between frequency and inductance with respect to the semiconductor module 1 according to the embodiment and the semiconductor module 1A according to the comparison example. FIG. 10 is a graph in a case where both the first semiconductor chip Q1 and the fourth semiconductor chip Q4 were turned on.

Figure 11:
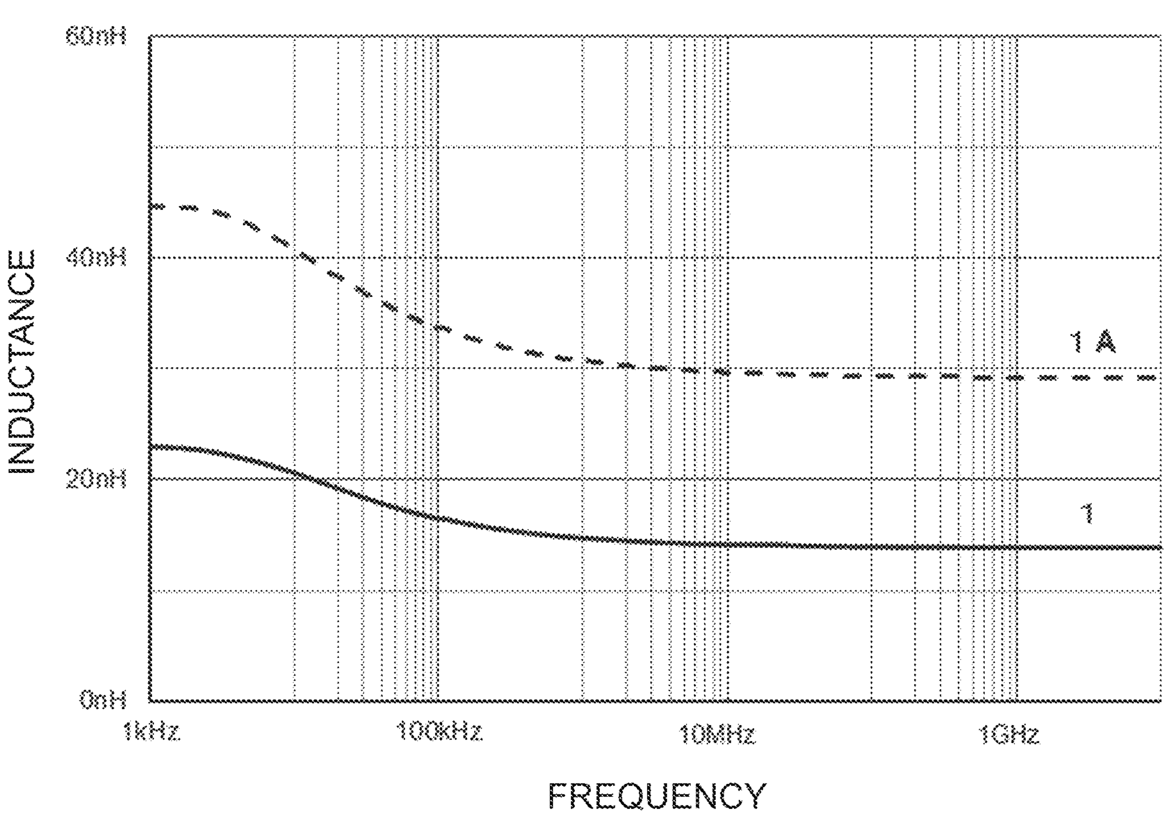
FIG. 11 is a view illustrating the relationship between frequency and inductance with respect to the semiconductor module 1 according to the embodiment and semiconductor module 1A according to the comparison example.

FIG. 11 is a graph illustrating a relationship between frequency and inductance with respect to the semiconductor module 1 according to the embodiment and the semiconductor module 1A according to the comparison example. FIG. 11 is a graph in a case where both the third semiconductor chip Q3 and the second semiconductor chip Q2 were turned on.

In the semiconductor module 1A, parasitic inductances that were generated in the current path A when both the first semiconductor chip Q1 and the fourth semiconductor chip Q4 were turned on (see FIG. 10) were 48 nanohenry (48 nH) at 1 KHz, 35 nanohenry (35 nH) at 100 kHz, and 30 nanohenry (30 nH) at 1 GHz, and parasitic inductances that were generated in the current path B when both the third semiconductor chip Q3 and the second semiconductor chip Q2 were turned on (see FIG. 11) were 44 nanohenry (44 nH) at 1 KHz, 34 nanohenry (34 nH) at 100 kHz, and 29 nanohenry (29H) at 1 GHz.

On the other hand, in the semiconductor module 1 according to the embodiment, parasitic inductances that were generated in the current path A when both the first semiconductor chip Q1 and the fourth semiconductor chip Q4 were turned on (see FIG. 10) were 23 nanohenry (23 nH) at 1 KHz, 17 nanohenry (17 nH) at 100 kHz, and 14 nanohenry (14 nH) at 1 GHZ, and parasitic inductances that were generated in the current path B when both the third semiconductor chip Q3 and the second semiconductor chip Q2 were turned on (see FIG. 11) were 23 nanohenry (23 nH) at 1 kHz, 17 nanohenry (17 nH) at 100 kHz, and 14 nanohenry (14 nH) at 1 GHZ.

It was confirmed from this result that the semiconductor module 1 according to the embodiment can reduce a parasitic inductance compared to the semiconductor module 1A in both the case where the first semiconductor chip Q1 and the fourth semiconductor chip Q4 were turned on and the case where the third semiconductor chip Q3 and the second semiconductor chip Q2 were turned on.

As has been described heretofore, in the semiconductor module 1 according to the embodiment, the first semiconductor chip Q1 and the third semiconductor chip Q3 are disposed in symmetry with respect to a center line, the second semiconductor chip Q2 and the fourth semiconductor chip Q4 are disposed in symmetry with respect to the center line, the first wiring pattern 10 and the third wiring pattern 30 are disposed in symmetry with respect to the center line, and the second wiring pattern 20 and the fourth wiring pattern 40 are disposed in symmetry with respect to the center line, the first intermediate point terminal 61 and the second intermediate point terminal 62 are disposed in symmetry with respect to the center line, and one second power source terminal 52 and the other second power source terminal 53 are disposed in symmetry with respect to the center line, and the fifth wiring pattern 50 and the first power source terminal 51 are respectively disposed in symmetry with respect to the center line. With such a configuration, according to the semiconductor module 1 of the embodiment, a length of the current path (wiring path length) when both the first semiconductor chip Q1 and the fourth semiconductor chip Q4 are turned on and a length of the current path (wiring path length) when both the third semiconductor chip Q3 and the second semiconductor chip Q2 are turned on can be set equal. As a result, a parasitic inductance of the current path (wiring) generated when both the first semiconductor chip Q1 and the fourth semiconductor chip Q4 are turned on and a parasitic inductance of the current path (wiring) generated when both the third semiconductor chip Q3 and the second semiconductor chip Q2 are turned on can be set equal. As a result, the parasitic inductance can be reduced.

Further, in the semiconductor module 1 according to the present invention, the first intermediate point terminal 61 and the second intermediate point terminal 62 are disposed in symmetry with respect to the center line, one second power source terminal 52 and the other second power source terminal 53 are disposed in symmetry with respect to the center line, the fifth wiring pattern 50 and the first power source terminal 51 are respectively disposed in symmetry with respect to the center line, the first intermediate point terminal 61 and the second intermediate point terminal 62 are disposed adjacently to each other on one side of the semiconductor module 1, the first power source terminal 51, one second power source terminal 52 and the other second power source terminal 53 are disposed on the other side of the semiconductor module 1, and the first power source terminal 51 is disposed in a space above the fifth wiring pattern 50 in a non-contact state and connects the first wiring pattern 10 and the third wiring pattern 30 to each other. With such a configuration, according to the module 1 of the embodiment, the current path when both the first semiconductor chip Q1 and the fourth semiconductor chip Q4 are turned on flows through the first semiconductor chip Q1 from the first power source terminal 51 and reaches the first intermediate point terminal 61, flows through a load not illustrated in the drawing from the first intermediate point terminal 61 and, thereafter, flows into the fifth wiring pattern 50 from the second intermediate point terminal 62 through the fourth semiconductor chip Q4 and, thereafter, reaches one second power source terminal 52 and the other second power source terminal 53. On the other hand, the current path when both the third semiconductor chip Q3 and the second semiconductor chip Q2 are turned on flows through the third semiconductor chip Q3 from the first power source terminal 51 and reaches the second intermediate point terminal 62, flows through a load not illustrated in the drawing from the second intermediate point terminal 62 and, thereafter, flows into the fifth wiring pattern 50 from the first intermediate point terminal 61 through the second semiconductor chip Q2 and, thereafter, reaches one second power source terminal 52 and the other second power source terminal 53. Accordingly, in both cases described above, current flows in opposite directions between the first power source terminal 51 and the fifth wiring pattern 50 and, at the same time, current flows in opposite directions between the first intermediate point terminal 61 and the second intermediate point terminal 62. As a result, a magnetic field that is generated in the first power source terminal 51 and the fifth wiring pattern 50 and a magnetic field that is generated in the first intermediate point terminal 61 and the second intermediate point terminal 62 cancel each other whereby a parasitic inductance can be reduced.

Further, according to the semiconductor module 1 of the embodiment, the second wiring pattern 20 and the fourth wiring pattern 40 are disposed such that the second wiring pattern 20 includes a neighboring region to which the first intermediate point terminal 61 is connected, the fourth wiring pattern 40 includes a neighboring region to which the second intermediate point terminal 62 is connected, and the neighboring regions are disposed adjacently to each other. Accordingly, magnetic fields generated due to currents that flow in these neighboring regions effectively cancel each other and hence, a parasitic inductance can be reduced.

Further, in the semiconductor module 1 according to the embodiment, the first wiring pattern 10 and the third wiring pattern 30 are disposed close to both sides of the fifth wiring pattern 50, one second power source terminal 52 and the other second c source terminal 53 are disposed on both sides of the fifth wiring pattern 50 and, further, the first power source terminal 51 has a T-shape. Accordingly, magnetic fields generated by currents that flow in these regions can efficiently cancel each other and hence, a parasitic inductance can be reduced.

The semiconductor module 1 according to the embodiment includes: the first decoupling capacitor 91 that is disposed in the vicinity of the first semiconductor chip Q1 and the second semiconductor chip Q2, and is connect to the first wiring pattern 10 and the fifth wiring pattern 50; and the second decoupling capacitor 92 that is disposed in the vicinity of the third semiconductor chip Q3 and the fourth semiconductor chip Q4, and is connect to the third wiring pattern 30 and the fifth wiring pattern 50. These decoupling capacitors temporarily store electricity and hence, the decoupling capacitors absorb a changing current which causes noises whereby the generation of noises and a change in a power source voltage can be prevented. Further, the decoupling capacitors are provided to the respective two switching circuits arranged in parallel to each other and hence, the generation of noises and a change in a power source voltage can be efficiently prevented.

Further, in the semiconductor module 1 according to the embodiment, the fifth wiring pattern 50 is disposed at the center portion as viewed in a plan view. The fifth wiring patter 50 includes: the first portion that is positioned on the other side of the semiconductor module 1, is connected between one second power source terminal 52 and the other second power source terminal 52; the second portion that is positioned between the first wiring pattern 10 and the third wiring pattern 30; and the third portion that protrudes from one side of the semiconductor module 1 from the second portion. The protruding portion 54 having a tapered shape that includes the first oblique side 55 and the second oblique side 56 is formed on the third portion. With such a configuration, the first power source terminal 51 can be disposed in a space above a portion of the fifth wiring pattern 50 having a wide width (the first portion and the second portion) in a non-contact state and hence, a width of the first power source terminal 51 can be widened. As a result, the parasitic inductance can be reduced.

Further, in the semiconductor module 1 according to the embodiment, the oblique side that follows the first oblique side 55 of the fifth wiring pattern 50 is formed on the second wiring pattern 20, and the oblique side that follows the second oblique side 56 of the fifth wiring pattern 50 is formed on the fourth wiring pattern 40. With respect to the second semiconductor chip Q2, the first side a1 of the second semiconductor chip Q2 is disposed along the first oblique side 55 of the fifth wiring pattern 50, and the source electrode S2 of the second semiconductor chip Q2 is connected to the fifth wiring pattern 50 via the second connection member 82. With respect to the fourth semiconductor chip Q4, the first side a1 of the fourth semiconductor chip Q4 is disposed along the second oblique side 56 of the fifth wiring pattern 50, and the source electrode S4 of the fourth semiconductor chip Q4 is connected to the fifth wiring pattern 50 via the fourth connection member 84. Accordingly, the current path from the load to the fifth wiring pattern 50 can be shortened. As a result, the parasitic inductance can be reduced.

Further, according to the semiconductor module 1 of the embodiment, the first power source terminal 51, one second power source terminal 52, the other second power source terminal 53, the first intermediate point terminal 61, and the second intermediate point terminal 62 are formed such that the width of each of the inner lead portions 51*a*, 52*a*, 53*a*, 61*a*, 62*a* thereof are wider than the width of each of the outer lead portions 51*b*, 52*b*, 53*b*, 61*b*, 62*b* thereof. Accordingly, widths of the current paths can be widened. As a result, the parasitic inductance can be reduced.

The present invention is not limited to the embodiment described above and can be carried out various modifications without departing from the gist of the present invention. For example, the following modifications can be also carried out.

(1) The shapes, the numbers, the sizes, the positions, and the like of the constitutional elements according to the present invention are not limited to the values illustrated in FIG. 2, and can be suitably changed provided that the technical features of the present invention are not impaired.

(2) In the embodiment described above, the semiconductor module of the present invention has been described by taking the DC-DC convertor as the example. However, the present invention is not limited to such semiconductor module. The present invention is also applicable to circuits other than the DC-DC converter (for example, an AC-DC convertor such as totem pole type bridgeless PFC circuit or the like). In this case, the first and second intermediate point terminals of the present invention (the first and second intermediate point terminals 61, 62 of the embodiment) form the respective input power source terminals. Further, the first power source terminal and one and the other second power source terminals (the first power source terminal 51 and one and the other second power source terminals 52, 53 in the embodiment) become the respective output power source terminals. The totem pole type bridgeless PFC circuit is specifically used for high frequency applications and hence, in a case where the present invention is applied to the totem pole type bridgeless PFC circuit, a specifically outstanding parasitic inductance reducing effect can be acquired.

Figure 12:
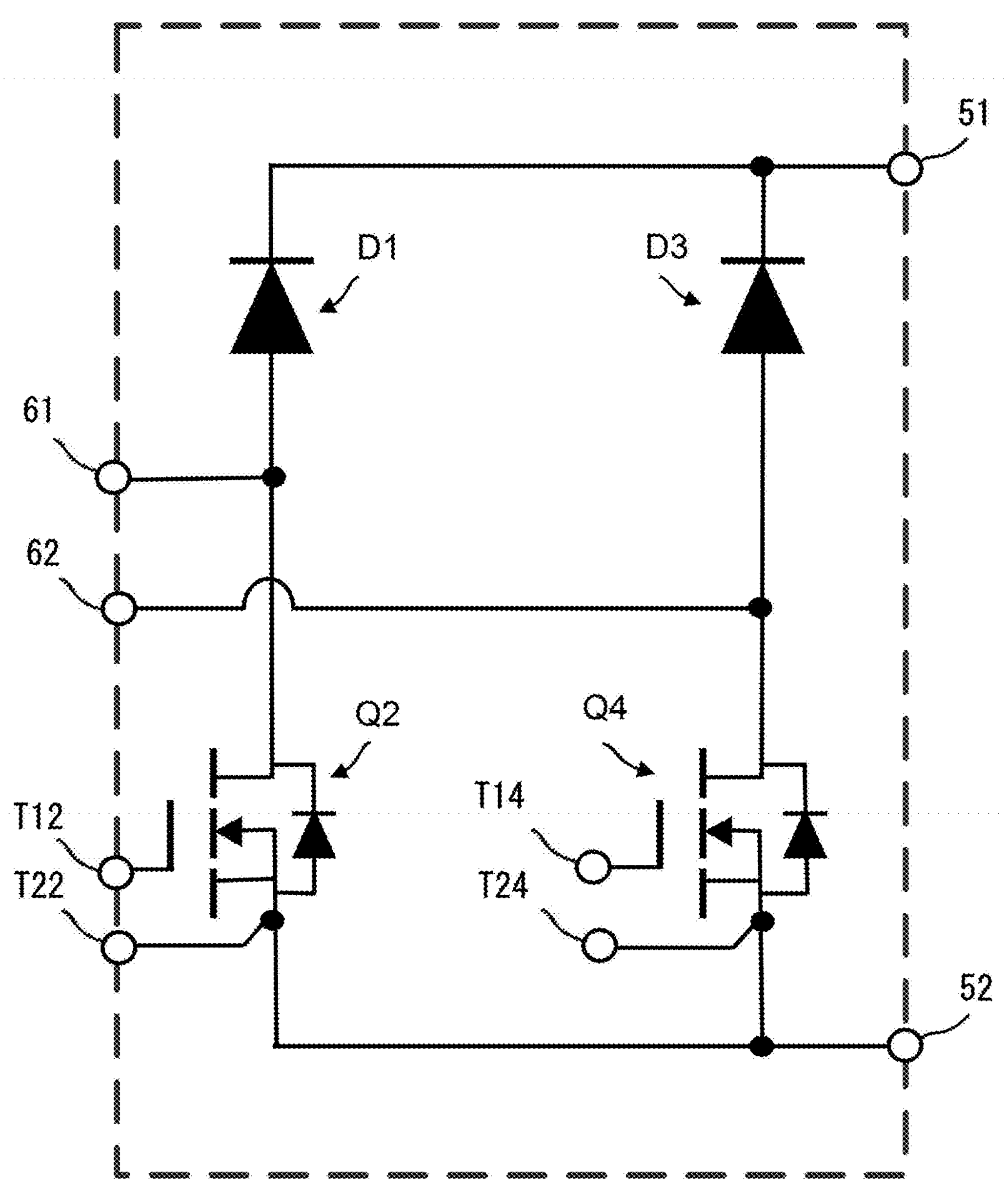
FIG. 12 is an equivalent circuit diagram of semiconductor module according to a modification 1.
Figure 13:
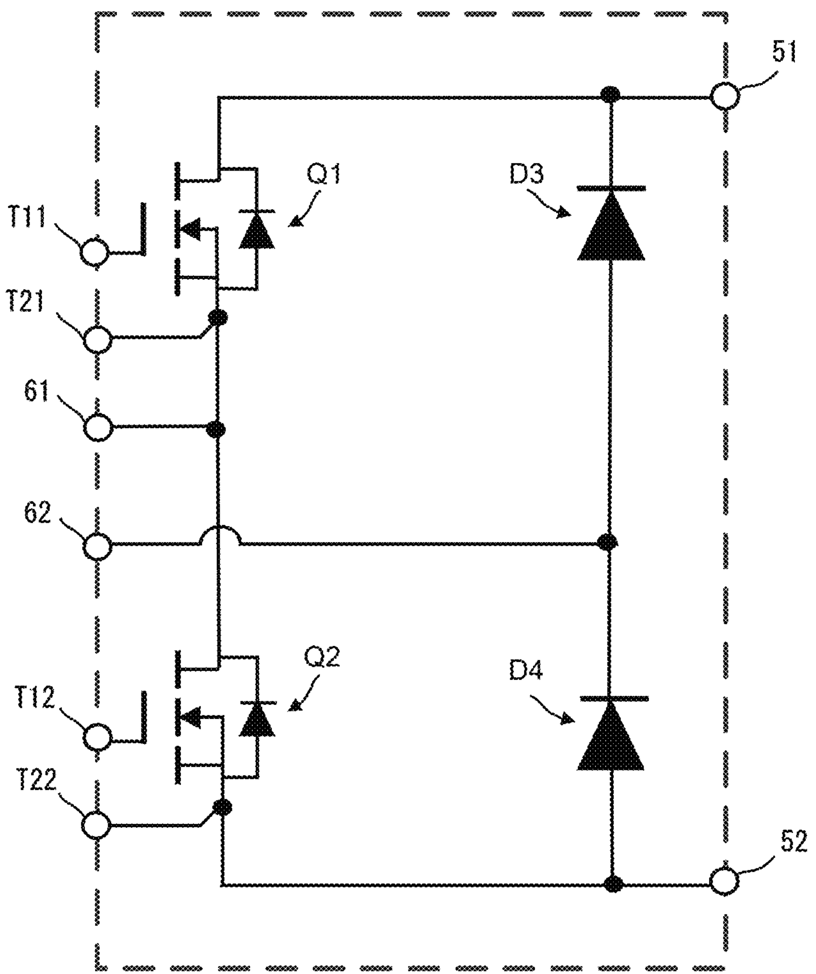
FIG. 13 is an equivalent circuit diagram of a semiconductor module according to a modification 2.
Figure 14:
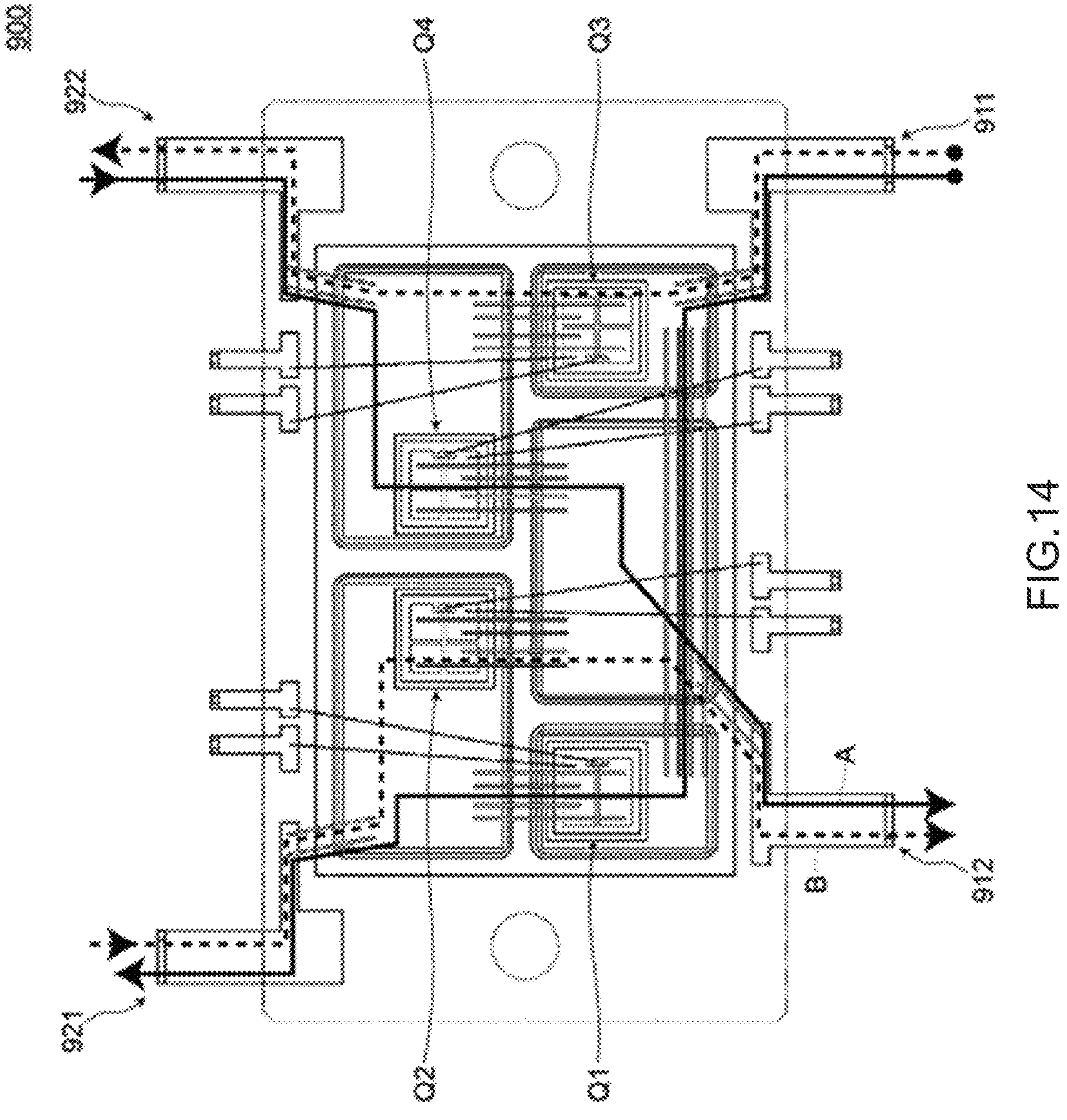
FIG. 14 is a plan view illustrating the internal configuration of a semiconductor device 900 described in patent literature 1.

(3) In the above-mentioned embodiment, a MOSFET is used as the semiconductor chips Q1 to Q4. However, the semiconductor chip in the semiconductor module according to the present invention is not limited to the MOSFET. As the semiconductor chip, for example, a transistor of other type such as an insulated gate bipolar transistor (IGBT) or a GaN transistor can be used. Further, a diode may be also used. FIG. 12 is an equivalent circuit diagram of the semiconductor module according to a modification 1. FIG. 13 is an equivalent circuit diagram of a semiconductor module according to a modification 2. The present invention is also applicable to a bridgeless PFC circuit illustrated in FIG. 12 (the bridgeless PFC circuit using two transistors and two diodes), and a totem pole bridgeless PFC circuit illustrated in FIG. 13 (the totem pole type bridgeless PFC circuit using two transistors and two diodes). In these cases, as the transistor, various transistors such as a MOSFET, an IGBT, a GaN transistor or the like can be used, for example.

(4) In the above-mentioned embodiment, the case is exemplified where the first oblique side 55 and the second oblique side 56 that the protruding portion 54 formed on the fifth wiring pattern 50 includes are formed of a straight line. However, the present invention is not limited to such a case, the first oblique side 55 and the second oblique side 56 may be formed of a curved line that gently curves, or formed of a line having some unevenness such as a stepped shape, for example. These sides having such shapes may be also included in the first oblique side and the second oblique side of the present invention. Further, in the description of the embodiment described above, the case is exemplified where a distal end of the protruding portion is sharpened. However, a protruding portion having a rounded distal end or a protruding portion having a leveled distal end are also included in the protruding portion of the present invention.

(5) In embodiment described above, the case is exemplified where the angle made by the first oblique side 55 and the second oblique side 56 that the protruding portion 54 formed on the fifth wiring pattern 50 has is set to 90 degrees. However, the present invention is not limited to such a case. The above-mentioned angle is not necessarily 90 degrees. It is possible to set an angle that can shorten current paths from the second semiconductor chip Q2 and the fourth semiconductor chip Q4 to the fifth wiring pattern 50 as short as possible, that is, a parasitic inductance can be reduced.

(6) In the embodiment described above, the first to fourth connection members, an aluminum wire is used for forming the first to fourth control connection members and the first to fourth detection connection members. However, the present invention is not limited to such a case. In place an aluminum wire, a metal wire such as a copper wire or a gold wire can be used. Further, a metal ribbon such as an aluminum ribbon can be used, and a metal clip such as a plate-shaped copper clip can be also used.

(7) In the present invention, the shapes of the wiring patterns are not also limited to the shapes illustrated in FIG. 2, and can be formed in various shapes with suitable modifications.

REFERENCE SIGNS LIST

1: semiconductor module
1A: semiconductor module prepared for comparison
10: first wiring pattern
20: second wiring pattern
22: oblique side of second wiring pattern
30: third wiring pattern
40: fourth wiring pattern
42: oblique side of fourth wiring patten 40
50: fifth wiring pattern
51: first power source terminal
51*a*: inner lead portion of first power source terminal 51
51*b*: outer lead portion of first power source terminal 51
52: one second power source terminal
52*a*: inner lead portion of one second power source terminal 52
52*b*: outer lead portion of one second power source terminal 52
53: the other second power source terminal
53*a*: inner lead portion of the other second power source terminal 53
53*b*: outer lead portion of the other second power source terminal 53
54: protruding portion having a tapered shape
55: first oblique side
56: second oblique side
61: first intermediate point terminal
61*a*: inner lead portion of first intermediate point terminal 61
61*b*: outer lead portion of first intermediate point terminal 61
62: second intermediate point terminal
62*a*: inner lead portion of second intermediate point terminal 62
62*b*: outer lead portion of second intermediate point terminal 62
70: substrate
81 to 84: first to fourth connection members
90: decoupling capacitor of semiconductor module 1A
91: first decoupling capacitor
92: second decoupling capacitor
100: bridge circuit
111 to 114: first to fourth control wiring patterns
121 to 124: first to fourth detection wiring patterns
131 to 134: first to fourth control connection members
141 to 144: first to fourth detection connection members
210: first wiring pattern of semiconductor module 1A
220: second wiring pattern of semiconductor module 1A
230: third wiring pattern of semiconductor module 1A
240: fourth wiring pattern of semiconductor module 1A
251: first power source terminal of semiconductor module 1A
252: second power source terminal of semiconductor module 1A
261: first intermediate point terminal of semiconductor module 1A
262: second intermediate point terminal of semiconductor module 1A
511: connection portion with first wiring pattern 10
512: connection portion with third wiring pattern 30
513: space forming portion
Q1: first semiconductor chip
Q2: second semiconductor chip
Q3: third semiconductor chip
Q4: fourth semiconductor chip
a1: first sides (first short sides) of semiconductor chips Q1 to Q4
D1 to D4: drain electrodes of semiconductor chips Q1 to Q4
G1 to G4: gate electrodes of semiconductor chips Q1 to Q4
M: mold
S1 to S4: source electrodes of semiconductor chips Q1 to Q4
T11 to T14: first to fourth control terminals
T21 to T24: first to fourth detection terminals

The invention claimed is:

1. A semiconductor module comprising: first to fourth semiconductor chips; first to fifth wiring patterns; a first power source terminal; one second power source terminal; an other second power source terminal; and a first intermediate point terminal and a second intermediate point terminal thus forming a bridge circuit in the semiconductor module, wherein, the bridge circuit is formed where the first semiconductor chip and the third semiconductor chip are chips disposed on a high side, and the second semiconductor chip and the fourth semiconductor chip form chips disposed on a low side, wherein the first semiconductor chip and the third semiconductor chip are disposed in symmetry with respect to a center line, the second semiconductor chip and the fourth semiconductor chip are disposed in symmetry with respect to the center line, the first wiring pattern and the third wiring pattern are disposed in symmetry with respect to the center line, and the second wiring pattern and the fourth wiring pattern are disposed in symmetry with respect to the center line, the first intermediate point terminal and the second intermediate point terminal are disposed in symmetry with respect to the center line, and the one second power source terminal and the other second power source terminal are disposed in symmetry with respect to the center line, the fifth wiring pattern and the first power source terminal are respectively disposed in symmetry with respect to the center line, the first intermediate point terminal and the second intermediate point terminal are disposed adjacently to each other on one side of the semiconductor module, the first power source terminal, the one second power source terminal and the other second power source terminal are disposed on an other side of the semiconductor module, and the first power source terminal is disposed in a space above the fifth wiring pattern in a non-contact state and connects the first wiring pattern and the third wiring pattern to each other.

2. The semiconductor module according to claim 1, wherein the second wiring pattern and the fourth wiring pattern are disposed such that the second wiring pattern includes a neighboring region to which the first intermediate point terminal is connected, the fourth wiring pattern includes a neighboring region to which the second intermediate point terminal is connected, and the neighboring regions are disposed adjacently to each other.

3. The semiconductor module according to claim 1, wherein the first wiring pattern and the third wiring pattern are disposed adjacently to both sides of the fifth wiring pattern, and the one second power source terminal and the other second power source terminal are disposed on both sides of the fifth wiring pattern, and the first power source terminal has a T-shape.

4. The semiconductor module according to claim 1, further comprising:

a first decoupling capacitor that is disposed in a vicinity of the first semiconductor chip and the second semiconductor chip, and is connected to the first wiring pattern and the fifth wiring pattern; and a second decoupling capacitor that is disposed in a vicinity of the third semiconductor chip and the fourth semiconductor chip, and is connected to the third wiring pattern and the fifth wiring pattern.

5. The semiconductor module according to claim 1, wherein the fifth wiring pattern is disposed at a center portion as viewed in a plan view, and includes:

a first portion that is positioned on the other side of the semiconductor module, and to which the one second power source terminal and the other second power source terminal are connected;

a second portion that is positioned between the first wiring pattern and the third wiring pattern;

and a third portion that protrudes to the one side of the semiconductor module from the second portion, the third portion including a protruding portion having a tapered shape that includes a first oblique side and a second oblique side.

6. The semiconductor module according to claim 1, wherein the first semiconductor chip includes a first gate electrode, a first source electrode and a first drain electrode, the first gate electrode is connected to a first control terminal via a first control connection member and a first control wiring pattern, the first source electrode is connected to a first detection terminal via a first detection connection member and a first detection wiring pattern, and is also connected to the second wiring pattern via a first connection member, and the first drain electrode is connected to the first wiring pattern, the second semiconductor chip includes a second gate electrode, a second source electrode and a second drain electrode, the second gate electrode is connected to a second control terminal via a second control connection member and a second control wiring pattern, the second source electrode is connected to a second detection terminal via a second detection connection member and a second detection wiring pattern, and is also connected to the fifth wiring pattern via a second connection member, and the second drain electrode is connected to the second wiring pattern, the third semiconductor chip includes a third gate electrode, a third source electrode and a third drain electrode, the third gate electrode is connected to a third control terminal via a third control connection member and a third control wiring pattern, the third source electrode is connected to a third detection terminal via a third detection connection member and a third detection wiring pattern, and is also connected to the fourth wiring pattern via a third connection member, and the third drain electrode is connected to the third wiring pattern, the fourth semiconductor chip includes a fourth gate electrode, a fourth source electrode and a fourth drain electrode, the fourth gate electrode is connected to a fourth control terminal via a fourth control connection member and a fourth control wiring pattern, the fourth source electrode is connected to a fourth detection terminal via a fourth detection connection member and a fourth detection wiring pattern, and is also connected to the fifth wiring pattern via a fourth connection member, and the fourth drain electrode is connected to the fourth wiring pattern, an oblique side that follows a first oblique side of the fifth wiring pattern is formed on the second wiring pattern, and an oblique side that follows a second oblique side of the fifth wiring pattern is formed on the fourth wiring pattern, the second semiconductor chip is configured such that, assuming one side out of a plurality of sides of the second semiconductor chip as a first side of the second semiconductor chip, the first side of the second semiconductor chip is disposed along the first oblique side of the fifth wiring pattern, and the fourth semiconductor chip is configured such that, assuming one side out of a plurality of sides of the fourth semiconductor chip as a first side of the fourth semiconductor chip, the first side of the fourth semiconductor chip is disposed along the second oblique side of the fifth wiring pattern.

7. The semiconductor module according to claim 1, wherein the first power source terminal, the one second power source terminal, the other second power source terminal, the first intermediate point terminal, and the second intermediate point terminal are formed such that a width of each of inner lead portions thereof is set larger a width of each of outer lead portions thereof.

* * * * *